United States Patent
Itou et al.

(10) Patent No.: US 10,199,567 B2
(45) Date of Patent: Feb. 5, 2019

(54) SENSOR AND METHOD FOR PRODUCING SAME

(71) Applicant: DENSO CORPORATION, Kariya, Aichi-pref. (JP)

(72) Inventors: Takeshi Itou, Kariya (JP); Takamitsu Kubota, Kariya (JP); Yoshiyuki Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/568,908

(22) PCT Filed: Jun. 7, 2016

(86) PCT No.: PCT/JP2016/066843
§ 371 (c)(1),
(2) Date: Oct. 24, 2017

(87) PCT Pub. No.: WO2016/204013
PCT Pub. Date: Dec. 22, 2016

(65) Prior Publication Data
US 2018/0102473 A1 Apr. 12, 2018

(30) Foreign Application Priority Data

Jun. 19, 2015 (JP) .................................. 2015-123793
May 11, 2016 (JP) .................................. 2016-095266

(51) Int. Cl.
| | | |
|---|---|---|
| H01L 43/04 | (2006.01) |
| H01L 27/22 | (2006.01) |
| H01L 43/14 | (2006.01) |
| H01L 25/16 | (2006.01) |
| H01L 43/06 | (2006.01) |
| G01D 5/14 | (2006.01) |
| H03H 7/06 | (2006.01) |

(Continued)

(52) U.S. Cl.
CPC ............. *H01L 43/04* (2013.01); *G01D 5/145* (2013.01); *G01D 5/24428* (2013.01); *H01L 23/3107* (2013.01); *H01L 25/16* (2013.01); *H01L 27/22* (2013.01); *H01L 43/065* (2013.01); *H01L 43/14* (2013.01); *H03H 7/06* (2013.01)

(58) Field of Classification Search
CPC ....... H01L 43/14; H01L 43/04; H01L 43/065; H01L 27/22; H01L 25/16
See application file for complete search history.

(56) References Cited

U.S. PATENT DOCUMENTS

| | | | | |
|---|---|---|---|---|
| 6,396,137 B1 * | 5/2002 | Klughart | ................. | H01L 25/16 257/691 |
| 2007/0247143 A1 | 10/2007 | Ikeda et al. | | |
| 2010/0032670 A1 | 2/2010 | Aggarwal et al. | | |

(Continued)

*Primary Examiner* — Seahvosh Nikmanesh
(74) *Attorney, Agent, or Firm* — Nixon & Vanderhye P.C.

(57) ABSTRACT

A sensor includes: an integrated circuit having a power supply lead, a ground lead and a signal lead; a power supply terminal connected to the power supply lead; a ground terminal connected to the ground lead; a first signal terminal connected to the signal lead; a second signal terminal connected to the first signal terminal; a filter member having one end connected to one of the terminals and another end connected to another one of the terminals; and a sealing body sealing the integrated circuit, the terminals and the filter member. A part of each terminal is exposed from the sealing body.

9 Claims, 19 Drawing Sheets

(51) Int. Cl.
*G01D 5/244* (2006.01)
*H01L 23/31* (2006.01)

(56) References Cited

U.S. PATENT DOCUMENTS

2015/0061657 A1   3/2015   Takiguchi et al.
2017/0276694 A1*  9/2017   Uehara .................... G01P 3/00

\* cited by examiner

SENSOR AND METHOD FOR PRODUCING SAME

CROSS REFERENCE TO RELATED APPLICATIONS

This application is the U.S. national phase of International Application No. PCT/JP2016/066843 filed on Jun. 7, 2016 which designated the U.S. and claims priority to Japanese Patent Applications No. 2015-123793 filed on Jun. 19, 2015, and No. 2016-95266 filed on May 11, 2016, the entire contents of each of which are incorporated herein by reference.

TECHNICAL FIELD

The present disclosure relates to a sensor formed by molding electronic components including an integrated circuit and a part of a terminal with a sealing body, and a method for producing the sensor.

BACKGROUND ART

Up to now, a sensor has been known which includes an integrated circuit that outputs an electric signal corresponding to a physical quantity relating to an object to be detected, multiple terminals that are connected to leads of the integrated circuit, capacitors disposed between the respective terminals, and a sealing body that molds the integrated circuit and the capacitors. The sensor disclosed in Patent Literature 1 uses a hall IC as the integrated circuit. A power supply terminal is connected to a power supply lead of the Hall IC, a ground terminal is connected to a ground lead, and a signal terminal is connected to a signal lead. Each capacitor is disposed between the ground terminal and the power supply terminal and between the ground terminal and the signal terminal.

An output signal of an integrated circuit compatible with a communication method such as a SENT communication is a digital signal. In the case of using the integrated circuit that outputs a digital signal in this way, a frequency of the output signal becomes higher as compared with the case of using an integrated circuit that outputs an analog signal. For that reason, an electric noise emitted to the outside of the sensor becomes relatively large. In order to reduce the noise, for example, a countermeasure for providing a π-type filter between the signal terminal and the ground terminal can be considered.

As described above, in order to provide the π-type filter, there is a need to connect a resistor in series in a middle of the signal terminal. For example, it is conceivable that the signal terminal is divided into two parts on an integrated circuit side and an external connection side, and a resistor is connected between those parts. However, when the signal terminal is divided into two parts at the time of soldering electronic components to the terminal, one component easily moves relative to the other component, and accurate soldering becomes difficult. For that reason, there is a problem that it is difficult to produce the sensor.

On the other hand, it is conceivable to solder the electronic components excluding the resistors to the terminal, then cut off the middle of the signal terminal, and connect the resistor in series to a cutting portion. However, when cutting the signal terminal, a stress is applied to the electronic components that have already been soldered, and the electronic components may be damaged. Further, there is a need to carry out a process of cutting the signal terminal during a soldering process, resulting in a problem that producing is difficult.

PRIOR ART LITERATURES

Patent Literature

Patent Literature 1: JP-2015-59883-A

SUMMARY

It is an object of the present disclosure to provide a sensor which is capable of reducing electrical noise emitted to an outside, easily produced, and capable of reducing breakage of electronic components during producing, and a method for producing the sensor.

According to a first aspect of the present disclosure, a sensor includes: an integrated circuit that includes a power supply lead, a ground lead and a signal lead, and outputs a detection signal corresponding to a physical quantity relating to a detection object; a power supply terminal that is connected to the power supply lead; a ground terminal that is connected to the ground lead; a first signal terminal that is connected to the signal lead; a second signal terminal that is electrically connected to the first signal terminal; a filter member having one connection end connected to one of the power supply terminal, the ground terminal, the first signal terminal, and the second signal terminal, and an other connection end connected to another one of the power supply terminal, the ground terminal, the first signal terminal and the second signal terminal; and a sealing body that seals the integrated circuit, the power supply terminal, the ground terminal, the first signal terminal, the second signal terminal and the filter member. A part of each of the power supply terminal, the ground terminal, the first signal terminal and the second signal terminal is exposed from the sealing body.

Since the sensor is provided with the filter member, the electrical noise emitted to the outside can be reduced.

In addition, since the power supply terminal, the ground terminal, the first signal terminal, and the second signal terminal are partially exposed from the sealing body, the sensor can be produced in a state where the exposed portions are connected to each other. For that reason, the respective terminals can be connected into one terminal at the time of terminal connection and filter connection. As a result, since the respective terminals can be integrated together in a terminal connecting process and a filter connecting process, a positional deviation such as lifting of the terminals can be prevented, thereby making it easy to produce the sensor.

In addition, since each terminal is partially exposed from the sealing body, after the electronic components including the integrated circuit and the filter members have been sealed and fixed by the sealing body, it is possible to disconnect between the terminals. With the above configuration, since there is no need to disconnect between the respective terminals during a process of connecting the filter members to the terminals, the sensor can be easily produced. In addition, since the stress to be applied to the electronic components can be reduced at the time of cutting the coupling portion of the respective terminals, the breakage of the electronic components during the producing can be reduced.

According to a second aspect of the present disclosure, a method for producing a sensor having: an integrated circuit that includes a power supply lead, a ground lead, and a signal lead, and outputs a detection signal corresponding to a physical quantity relating to a detection object; a power supply terminal that is connected to the power supply lead; a ground terminal that is connected to the ground lead; a first signal terminal that is connected to the signal lead; a second signal terminal that is electrically connected to the first signal terminal; a filter member having one connection end connected to one of the power supply terminal, the ground terminal, the first signal terminal and the second signal terminal, and an other connection end connected to another one of the power supply terminal, the ground terminal, the first signal terminal and the second signal terminal; and a sealing body that seals the integrated circuit, the power supply terminal, the ground terminal, the first signal terminal, the second signal terminal and the filter member, includes: connecting the power supply lead to the power supply terminal, connecting the ground lead to the ground terminal, and connecting the signal lead to the first signal terminal with a coupling terminal in which the power supply terminal, the ground terminal, the first signal terminal and the second signal terminal are coupled integrally by a coupling portion; connecting the filter member to the coupling terminal; sealing the integrated circuit, the power supply terminal, the ground terminal, the first signal terminal, the second signal terminal and the filter member with the sealing body to expose the coupling portion from the sealing body; and cutting the coupling portion at an outside of the sealing body to separate the power supply terminal, the ground terminal and the second signal terminal from each other.

In the method for producing the sensor described above, when the terminal connecting process and the filter connecting process are performed, since the respective terminals are integrated as a coupling terminal, the terminals can be fixed. This makes it possible to prevent a positional deviation such as terminal floating in the terminal connecting step and the filter connecting step and makes it easy to manufacture the sensor as compared with the case where the terminal connecting process and the filter connecting process are performed in a state where the terminals are separated from each other. Further, since the coupling portion of the coupling terminal is cut off outside of the sealing body in a state where the integrated circuit and the filter members are connected to the coupling terminal and sealed with the sealing body, the stress applied at the time of cutting can be reduced, and the electronic components can be prevented from being damaged.

BRIEF DESCRIPTION OF DRAWINGS

The above and other objects, features and advantages of the present disclosure will become more apparent from the following detailed description made with reference to the accompanying drawings. In the drawings.

EMBODIMENTS

Figure 1:
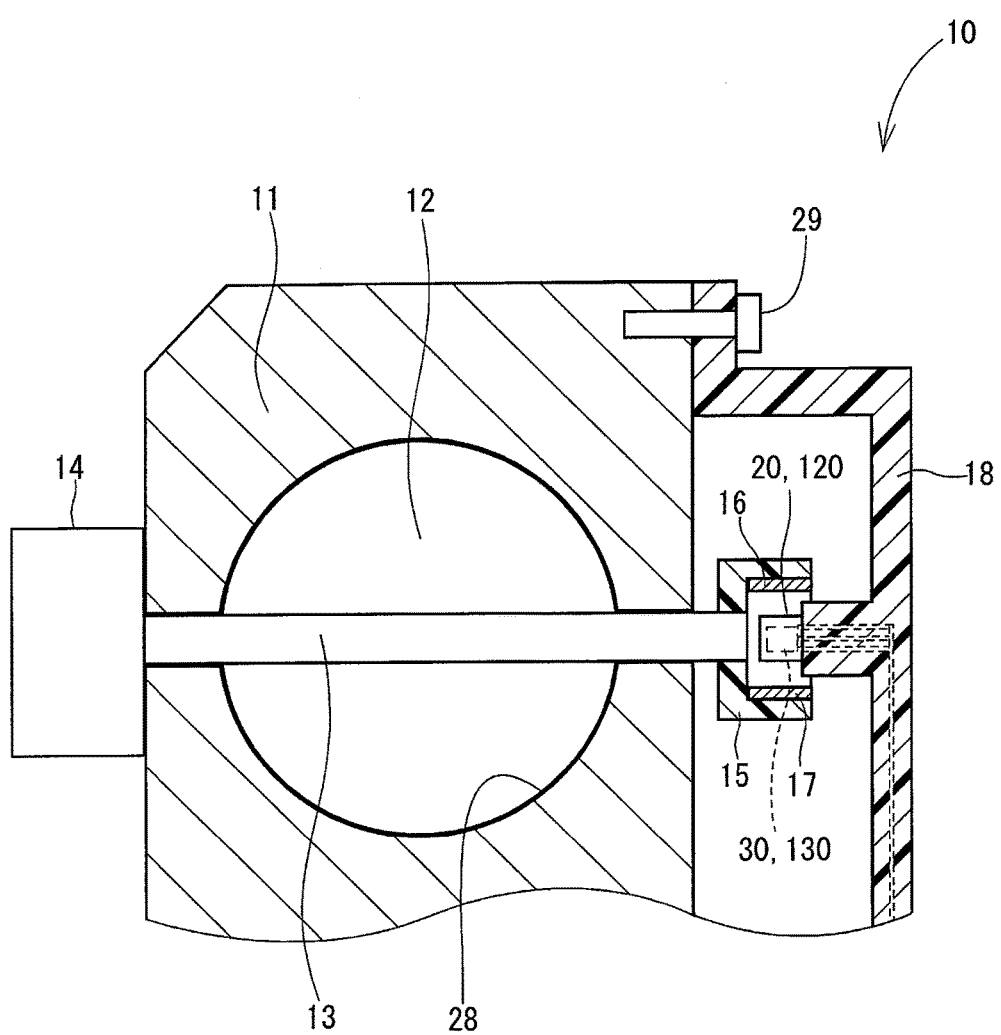
FIG. 1 is a diagram illustrating a throttle device using a sensor according to a first embodiment of the present disclosure.

Plural embodiments of the present disclosure will be described below with reference to the drawings. The same reference numerals are given to configuring elements which are substantially the same as those in the respective embodiments, and repetitive description thereof will be omitted.

First Embodiment

A first embodiment according to the present disclosure will be described with reference to FIGS. 1 to 13.

Sensors 20 and 120 according to a first embodiment of the present disclosure are used in a throttle device illustrated in FIG. 1. A throttle device 10 is an electronically controlled valve device that adjusts an intake air amount of an engine not shown.

First, the throttle device 10 will be described with reference to FIGS. 1 to 3.

The throttle device 10 includes a body 11, a valve body 12, a rotation shaft 13, a motor 14, a holder 15, magnets 16 and 17, a cover 18, sensors 20 and 120, and wires 22 to 27. A through hole 28 of the body 11 defines a part of an intake air passage in an engine. The valve body 12 rotates together with the rotation shaft 13 to change an opening degree of the through hole 28, that is, a throttle opening degree. The motor 14 rotationally drives the rotation shaft 13. The holder 15 is cylindrical, and is fixed to an end portion of the rotation shaft 13. The magnets 16 and 17 are fixed to an inner wall of the holder 15. A direction of the magnetic field between the magnet 16 and the magnet 17 varies according to a rotation angle of the rotation shaft 13. The cover 18 is provided so as to cover the holder 15 and the like, and is fixed to the body 11 by a screw 29.

Figure 13:
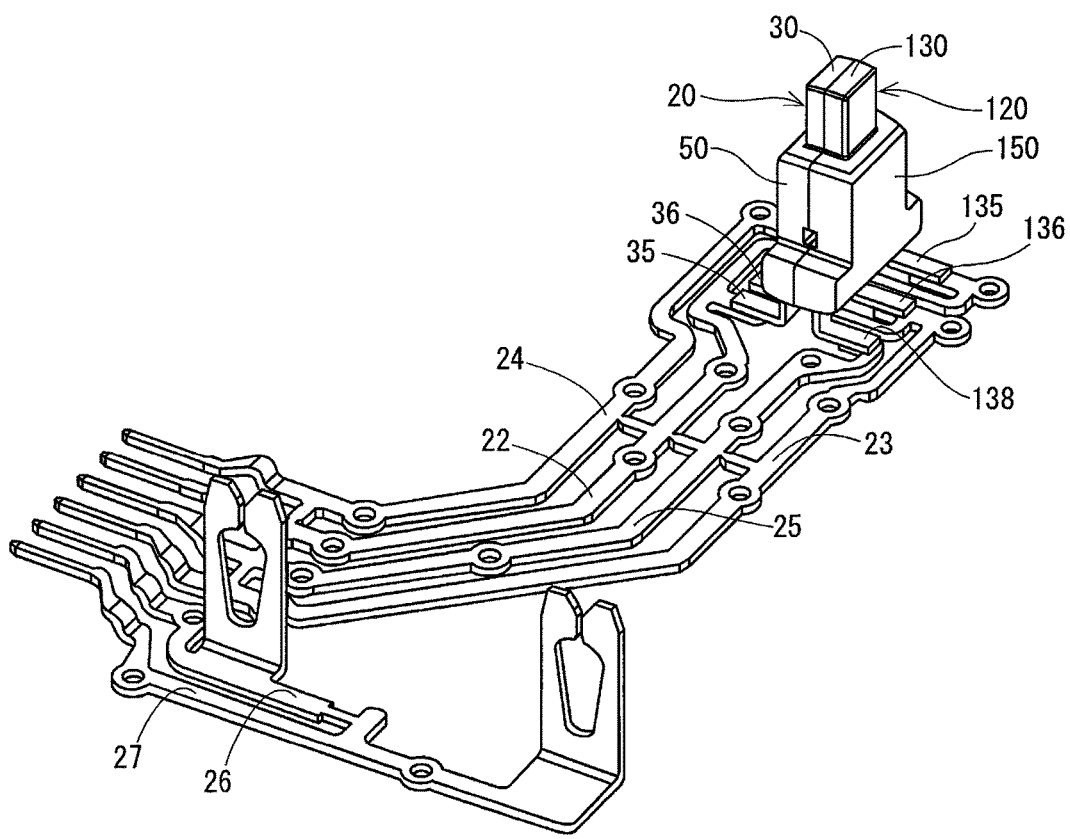
FIG. 13 is a perspective view illustrating a state in which the sensor is connected to wire according to the first embodiment of the present disclosure.

The sensor 20 has a Hall IC 30 located between the magnet 16 and the magnet 17. A magnetic flux density passing through a magnetic sensitive surface of the Hall element 301 inside the Hall IC 30 varies according to a direction of the magnetic field between the magnet 16 and the magnet 17. The Hall ICs 30 and 130 output detection signals corresponding to the rotation angle of the rotation shaft 13 corresponding to a "physical quantity relating to an object to be detected". The Hall IC 130 of the sensor 120 is configured in the same manner as that of the Hall IC 30, except that the direction of the magnetic sensitive surface of the Hall element 301 is different from that of the Hall IC 30. The Hall ICs 30 and 130 correspond to "integrated circuits". The wires 22 to 27 are intended for connecting the motor 14 and the sensors 20 and 120 to the outside. As illustrated in FIGS. 2 and 13, the wire 22 connects the sensors 20 and 120 to a power supply not shown such as a battery, and the wire 23 connects the sensors 20 and 120 to the ground. The wire 24 outputs a detection signal detected by the sensor 20 to an electronic control device not shown, and the wire 25 outputs a detection signal detected by the sensor 120 to the electronic control device. A part of the sensor 20 and a part of the wires 22 to 27 are buried in the cover 18. Hereinafter, the electronic control device will be referred to as "ECU".

The throttle device 10 configured as described above transmits the detection signal of the sensor 20 to an external ECU. The ECU calculates the throttle opening degree based on the detection signal received from the sensor 20, and determines a target value of the throttle opening degree based on vehicle information such as an accelerator opening degree. The ECU controls the motor 14 so that the detection value of the throttle opening degree coincides with the target value.

Figure 3:
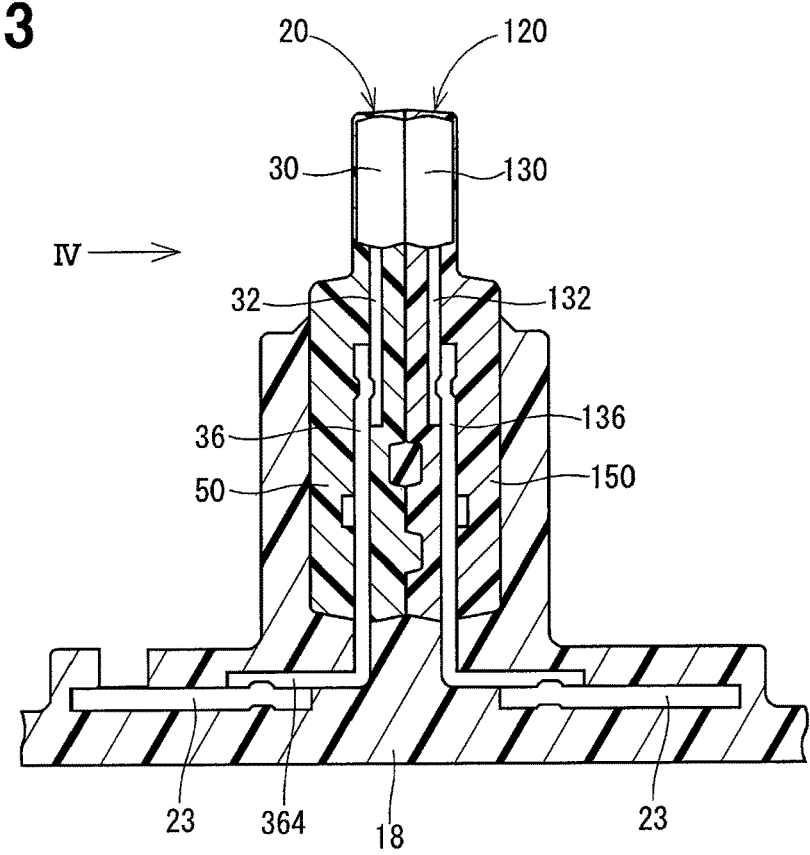
FIG. 3 is a diagram illustrating the vicinity of the sensor in a cross section taken along a line III-III of FIG. 2.
Figure 4:
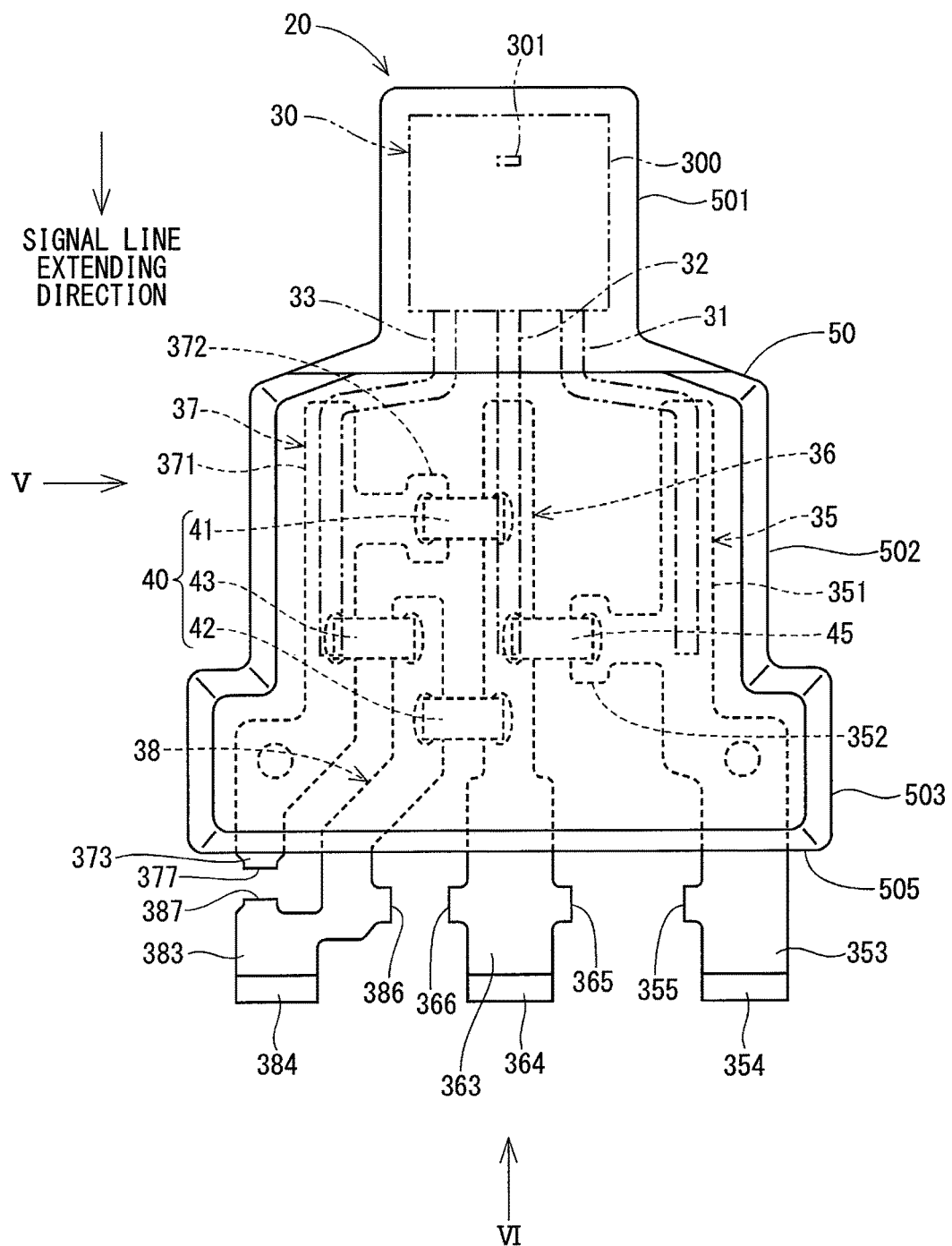
FIG. 4 is a top view illustrating the sensor according to the first embodiment of the present disclosure.
Figure 5:
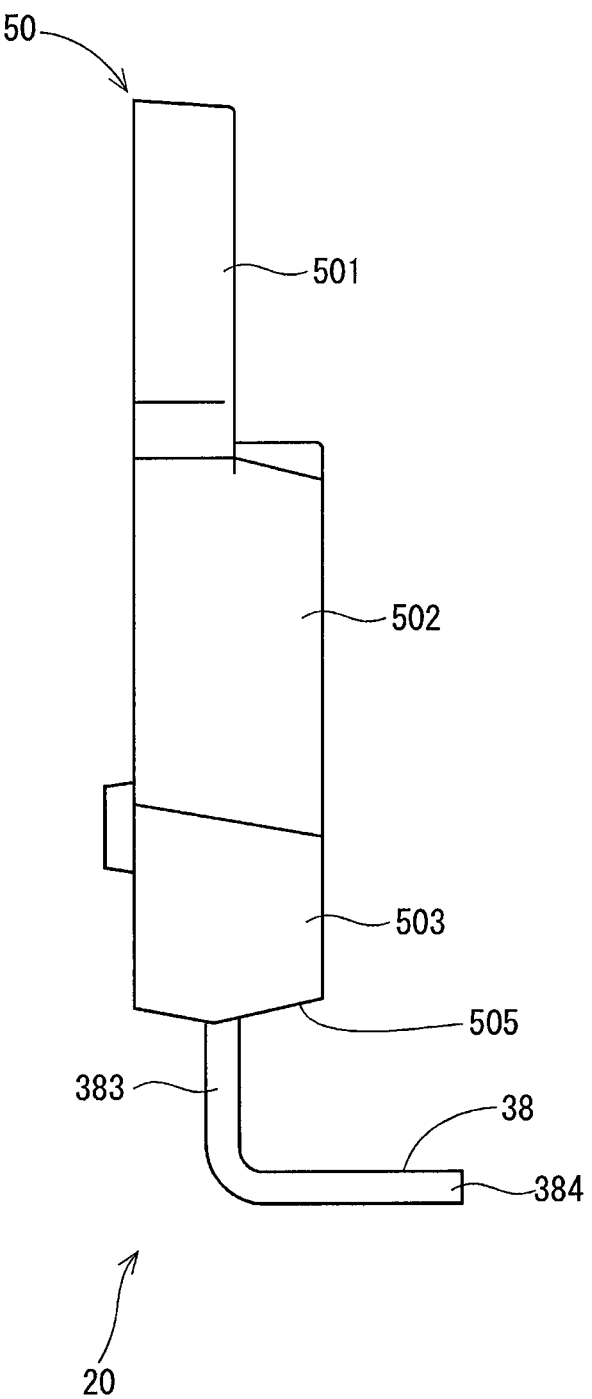
FIG. 5 is a view taken in a direction of an arrow V in FIG. 4.
Figure 6:
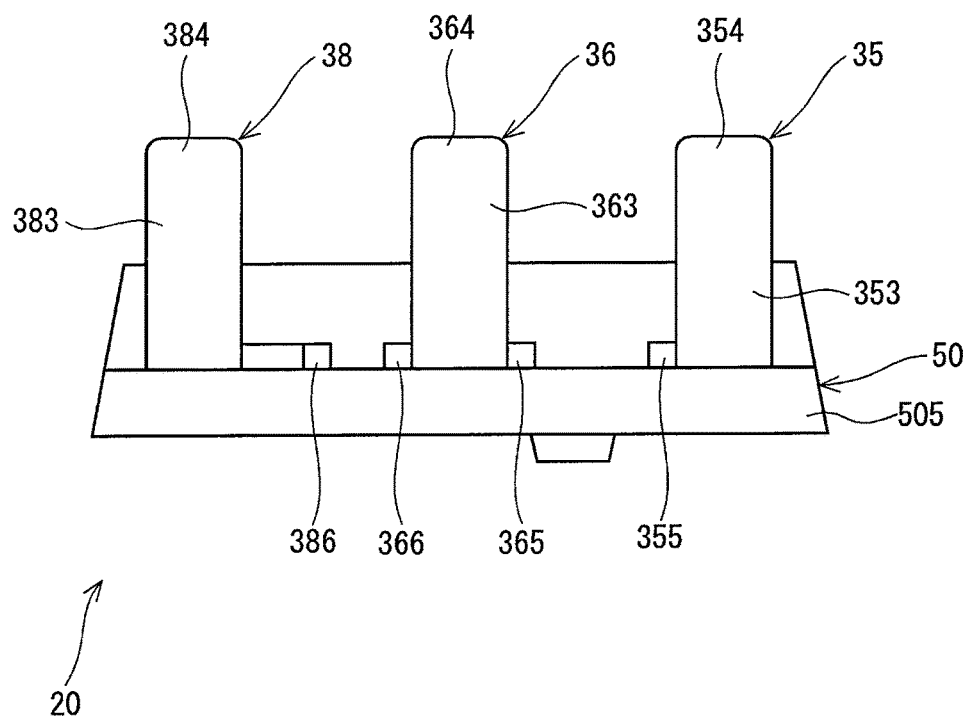
FIG. 6 is a view taken in a direction of an arrow VI in FIG. 4.

Next, the configuration of the sensors 20 and 120 will be described in detail with reference to FIGS. 3 to 6. FIG. 4 is a view seen from a direction IV in FIG. 3, FIG. 5 is a side view, and FIG. 6 is a bottom view.

In the figure, in order to distinguish between the sensor 20 and the sensor 120, in the configuration in which the sensor 20 is numbered by two digits, in the sensor 120, lower two digits are the same as the configuration of the corresponding sensor 20, and the sensor 120 is numbered by three digits with hundreds place as "1". As described above, the sensors 20 and 120 are identical with each other except for an orientation of the magnetic sensitive surface. Therefore, the sensor 20 will be described below.

As illustrated in FIGS. 3 to 6, the sensor 20 includes the Hall IC 30, a power supply terminal 35, a ground terminal 36, a first signal terminal 37, a second signal terminal 38, a first capacitor 41, a second capacitor 42, a resistor 43, a third capacitor 45 as a power supply side capacitor, a sealing body 50, and the like.

As illustrated in FIG. 4, the Hall IC 30 includes a sensor unit 300, a power supply lead 31, a ground lead 32, and a signal lead 33. The Hall IC 30 corresponds to a SENT communication, and an output signal of the Hall IC 30 is a digital signal.

The sensor unit 300 is provided with a Hall element 301 for detecting a change in magnetic flux according to the rotation angle of the rotation shaft 13, and is formed in a substantially rectangular shape.

The leads 31, 32, and 33 protrude from the same side surface of the sensor unit 300 and are arrayed in a stated order from one side. The power supply lead 31 is formed in parallel to the ground lead 32 on the side of the sensor unit 300, extends toward a side away from the ground lead 32 at an intermediate portion, and is formed in parallel to the ground lead 32 at a front end side. The ground lead 32 is formed so as to extend substantially straight from the sensor unit 300. The signal lead 33 is formed in parallel to the ground lead 32 on the side of the sensor unit 300, extends toward the side away from the ground lead 32 at the intermediate portion, and is formed in parallel to the ground lead 32 at the front end side.

Hereinafter, a protruding direction of the ground lead 32 (a vertical direction of a paper surface in FIG. 4 and the like) is referred to as "signal line extending direction". In addition, the term "parallel" as used in this example is not limited to strictly parallel but a deviation in manufacturing error is allowed. The same is applied to "parallel" and "vertical" in the description to be described later. In addition, in the figure, the Hall IC 30 is appropriately indicated by two-dot chain lines in order to avoid complicated overlapping portions between the leads 31 to 33 and the terminals 35 to 37. Further, a description of internal wires of the sensor unit 300 will be omitted. The same is applied to the drawings according to other embodiments.

The power supply terminal 35, the ground terminal 36, and the first signal terminal 37 correspond to the power supply lead 31, the ground lead 32, and the signal lead 33, and are disposed in a stated order from one side. Hereinafter, in the terminals 35 to 38, the Hall IC 30 side is referred to as "base end side", and an opposite side to the Hall IC 30 as "front end side".

The power supply terminal 35 includes a base portion 351 and a protrusion 352. The base portion 351 is formed so as to extend in the signal line extending direction and is formed so that the front end side is located at a side away from the ground terminal 36 more than the base end side. Further, the front end side of the base portion 351 is thicker than the base end side. The base end side of the base portion 351 is connected to the power supply lead 31. The protrusion 352 is formed so as to protrude from the base portion 351 toward the ground terminal 36 side.

The front end side of the base portion 351 of the power supply terminal 35 is exposed from the front end portion 505 which is an end portion of the sealing body 50 opposite to the side where the Hall IC 30 is provided. A portion of the power supply terminal 35 exposed from the sealing body 50 is defined as an exposed portion 353. The exposed portion 353 is formed with a width corresponding to the wire 22, bent, and connected to the wire 22 at a connection end portion 354. Further, a cutting portion 355 which is a cutting mark protruding toward the ground terminal 36 side is provided in the exposed portion 353.

The ground terminal 36 is formed to extend in the signal line extending direction as a whole. The ground terminal 36 is formed such that the front end side is thicker than the base end side. The base end side of the ground terminal 36 is connected to the ground lead 32.

The front end side of the ground terminal 36 is exposed from the front end portion 505 of the sealing body 50. A portion of the ground terminal 36 exposed from the sealing body 50 is defined as an exposed portion 363. The exposed portion 363 is formed with a width corresponding to the wire 23, bent, and connected to the wire 23 at a connection end portion 364. Also, the exposed portion 363 is provided with a cutting portion 365 which is a cutting mark protruding toward the power supply terminal 35 side, and a cutting portion 366 which is a cutting mark protruding toward the second signal terminal 38 side.

The first signal terminal 37 includes a base portion 371 and a protrusion 372. The base portion 371 is formed to extend in the signal line extending direction, and is formed so that the front end side is provided at the side away from the ground terminal 36 more than a base end side. The base end side of the base portion 371 is connected to the signal lead 33. The protrusion 372 is formed so as to protrude from the base portion 371 toward the ground terminal 36 side. In the present embodiment, the protrusion 372 of the first signal terminal 37 is formed closer to the base end side than the protrusion 352 of the power supply terminal 35.

The front end side of the base portion 371 of the first signal terminal 37 is exposed from the front end portion 505 of the sealing body 50. A portion of the first signal terminal 37 exposed from the sealing body 50 is defined as an exposed portion 373. In the first signal terminal 37, a cutting portion 377 as a cutting mark is defined on the front end side of the exposed portion 373.

The second signal terminal 38 is located on the front end side of the protrusion 372 and is disposed between the ground terminal 36 and the first signal terminal 37. The front end side of the second signal terminal 38 is formed at a side away from the ground terminal 36 as compared with the base end side. Unlike the other terminals 35 to 37, the base end side of the second signal terminal 38 is not connected to the leads 31 to 33 of the Hall IC 30.

The front end side of the second signal terminal 38 is exposed from the front end portion 505 of the sealing body 50. A portion of the second signal terminal 38 exposed from the sealing body 50 is defined as an exposed portion 383. The front end side of the exposed portion 383 is formed with a width corresponding to the wire 24, bent, and connected to the wire 24 at the connection end portion 384. In the present embodiment, the exposed portion 383 is formed with the front end side at a side away from the ground terminal 36 as compared with the protruded portion from the sealing body 50. A part of the exposed portion 383 is disposed on the front end side of the cutting portion 377 of the first signal terminal 37.

The exposed portion 383 is provided with a cutting portion 386 which is a cutting mark protruding toward the ground terminal 36 side. Further, a cutting portion 387 that is a cutting mark is formed at a position facing the cutting portion 377 of the first signal terminal 37 of the exposed portion 383.

A producing method such as cutting of the respective terminals will be described later.

The sensor 20 is provided with the first capacitor 41, the second capacitor 42, the resistor 43, and the third capacitor 45. In the present embodiment, the first capacitor 41, the second capacitor 42, the resistor 43, and the third capacitor 45 correspond to "filter members". All of the capacitors 41, 42, and 45 are of a chip type, and are so-called "chip capacitors". Further, the resistor 43 is of a chip type and is a so-called "chip resistor".

One connection end of the first capacitor 41 is connected to the protrusion 372 of the first signal terminal 37, and the other connection end of the first capacitor 41 is connected to the ground terminal 36.

One connection end of the second capacitor 42 is connected to the second signal terminal 38, and the other connection end of the second capacitor 42 is connected to the ground terminal 36 on the front end side of the first capacitor 41.

One connection end of the resistor 43 is connected to the base portion 371 of the first signal terminal 37 on the front end side of the protrusion 372, and the other end portion of the resistor 43 is connected to the second signal terminal 38 on the base end side of the second capacitor 42. In other words, in the present embodiment, the first signal terminal 37 and the second signal terminal 38 are electrically connected to each other through the resistor 43.

One connection end of the third capacitor 45 is connected to the protrusion 352 of the power supply terminal 35, and the other connection end of the third capacitor 45 is connected to the ground terminal 36 between the first capacitor 41 and the second capacitor 42. The third capacitor 45 is disposed between the first capacitor 41 and the second capacitor 42 in the signal line extending direction. The third capacitor 45 is intended to prevent the Hall IC 30 from being subjected to a high voltage caused by a static electricity.

In the present embodiment, all of the capacitors 41, 42, 45 and the resistor 43 are sealed with the sealing body 50. The first capacitor 41 is disposed so that a straight line connecting connection ends of the first capacitor 41 to each other is perpendicular to the signal line extending direction. Likewise, the capacitors 42, 45 and the resistor 43 are disposed such that straight lines connecting the respective connection ends to each other are perpendicular to the signal line extending direction. In other words, in the present embodiment, the directions connecting the respective connection ends of the capacitors 41, 42, 45 and the resistor 43 to each other are identical with each other.

The π-type filter 40 is a filter that includes the first capacitor 41, the second capacitor 42, and the resistor 43, and attenuates high frequency components. In the present embodiment, the first capacitor 41, the resistor 43, and the second capacitor 42 are disposed in a stated order from the base end side in the signal line extending direction.

Figure 7:
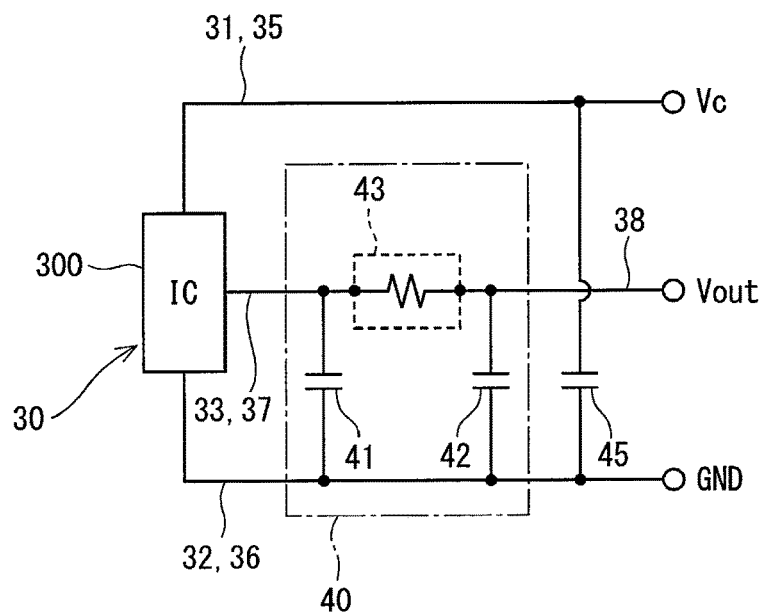
FIG. 7 is a circuit diagram illustrating a π-type filter according to the first embodiment of the present disclosure.

The circuit configuration of the π-type filter 40 is illustrated in FIG. 7.

As illustrated in FIG. 7, the first capacitor 41 is connected to the signal line and the ground on the Hall IC 30 side of the resistor 43. The second capacitor 42 is connected to the signal line and the ground on a side of the resistor 43 opposite to the Hall IC 30.

The resistor 43 is disposed in series with the signal line between a connection point of the first capacitor 41 and the signal line and a connection point of the second capacitor 42 and the signal line. In other words, in order to form the π-type filter 40, there is a need to connect the resistor 43 in series with the signal line. Therefore, in the present embodiment, the signal line is divided into the first signal terminal 37 and the second signal terminal 38. The first signal terminal 37 and the second signal terminal 38 are connected with the resistor 43, and the resistor 43 is disposed in series with the signal line. As a result, the detection signal of the Hall IC passes through the first signal terminal 37, the resistor 43, and the second signal terminal 38 in the stated order and is output to the ECU side.

As illustrated in FIG. 4, in the present embodiment, the capacitors 41, 42 and the resistor 43 forming the π-type filter 40 are incorporated in the sealing body 50, and the π-type filter 40 is disposed immediately below the Hall IC 30. For example, as a comparative example, in the case where a π-type filter is provided in an ECU connected to the sensor 20 via the wires 22 to 27, the noise generated by the Hall IC 30 may be radiated to the outside through the wires 22 to 27. On the other hand, in the present embodiment, since noise can be reduced inside the sensor 20 by disposing the π-type filter 40 directly below the Hall IC 30, radiation of noise to the outside can be reduced. Further, since the noise propagated to the wires 22 to 27 can be reduced by the π-type filter 40 provided inside the sensor 20, the penetration of noise from the outside into the Hall IC 30 can be reduced.

The sealing body 50 is made of resin or ceramic, for example, and molds the Hall IC 30, the terminals 35 to 38, the first capacitor 41, the second capacitor 42, the resistor 43, and the third capacitor 45. The sealing body 50 includes an IC sealing portion 501, an intermediate portion 502, and a terminal forming portion 503, which are integrally formed. The IC sealing portion 501 is formed in a shape corresponding to the sensor portion 300. The intermediate portion 502 is an intermediate region between the IC sealing portion 501 and the terminal forming portion 503. The intermediate portion 502 is formed to be wider than the IC sealing portion 501. The terminal forming portion 503 is formed to be wider than the intermediate portion 502. The terminals 35 to 38 are exposed from the front end portion 505 which is an end of the terminal forming portion 503 on the side opposite to the IC sealing portion 501.

Hereinafter, the Hall IC 30, the first capacitor 41, the second capacitor 42, the resistor 43, and the third capacitor 45 are appropriately referred to as "electronic components".

The power supply terminal 35, the ground terminal 36, the first signal terminal 37, and the second signal terminal 38 are partially exposed from the sealing body 50. In the present embodiment, all of the terminals 35 to 38 are exposed from the front end portion 505.

The exposed portion 353 of the power supply terminal 35 which is exposed from the sealing body 50 includes the connection end portion 354 that is connected to the wire 22, and a cutting portion 355 obtained by cutting a portion that has been coupled to the ground terminal 36 during production.

The exposed portion 363 of the ground terminal 36 which is a portion exposed from the sealing body 50 includes the connection end portion 364 that is connected to the wire 23, the cutting portion 365 obtained by cutting the portion that has been coupled to the power supply terminal 35 during production, and the cutting portion 366 obtained by cutting the portion coupled to the second signal terminal 38 during production.

The exposed portion 383 of the second signal terminal 38 which is a portion exposed from the sealing body 50 includes the connection end portion 384 that is connected to the wire 24, the cutting portion 386 obtained by cutting the portion that has been coupled to the ground terminal 36 during production, and the cutting portion 387 obtained by cutting the portion coupled to the first signal terminal 37 during production.

The exposed portion 373 of the first signal terminal 37 which is exposed from the sealing body 50 includes the cutting portion 377 obtained by cutting the portion that has been coupled to the second signal terminal 38 during production.

In the sensor 20 configured as described above, the power supply terminal 35, the ground terminal 36, the first signal terminal 37, and the second signal terminal 38 can couple the respective portions exposed from the sealing body 50 with each other since the electronic components are connected to the terminals until the sealing body 50 is formed.

Next, a method for producing the sensor 20 will be described with reference to FIGS. 8 to 12. The method for producing the sensor is identical with that in second to fifth embodiments.

Figure 8:
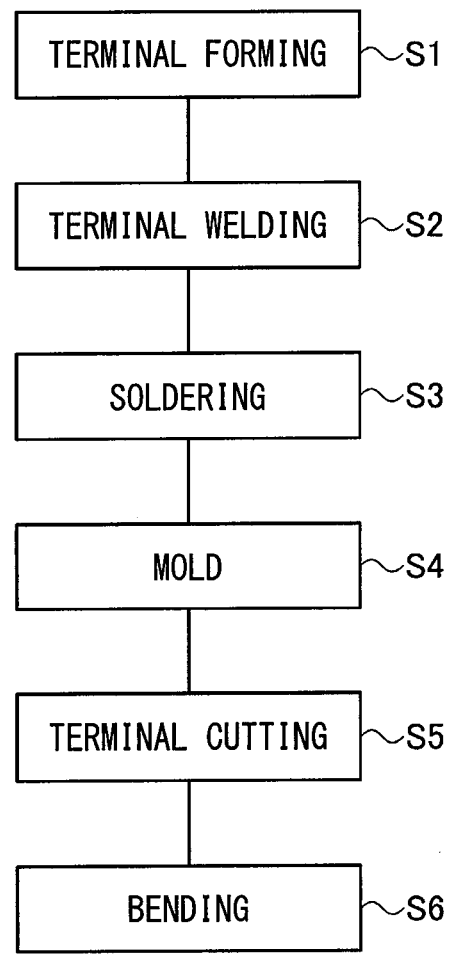
FIG. 8 is a flowchart illustrating a method for producing the sensor according to the first embodiment of the present disclosure.
Figure 9:
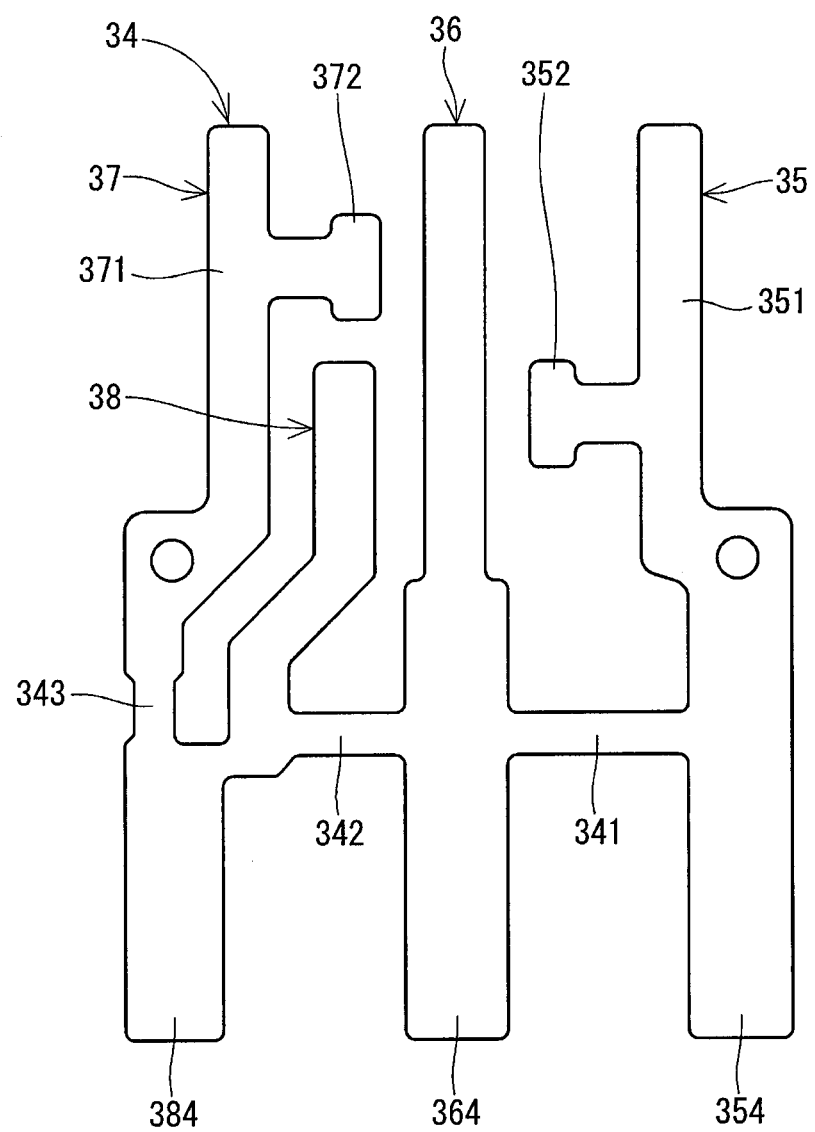
FIG. 9 is a top view illustrating a coupling terminal formed in a terminal forming process according to the first embodiment of the present disclosure.

As illustrated in FIG. 8, first Step S1 is a terminal forming process. In the terminal forming process, as illustrated in FIG. 9, a coupling terminal 34 is formed in which the terminals 35 to 38 are coupled to each other through the coupling portions 341, 342, and 343. In detail, the coupling portion 341 couples the power supply terminal 35 with the ground terminal 36 perpendicularly to the signal line extending direction. The coupling portion 342 couples the ground terminal 36 with the second signal terminal 38 in a direction perpendicular to the signal line extending direction. The coupling portion 343 couples the first signal terminal 37 with the second signal terminal 38 in parallel with the signal line extending direction. In other words, the coupling portions 341 and 342 couple the terminals 35, 36 and 38 in a lateral direction of the page surface, and the coupling portion 343 couples the signal terminals 37 and 38 in a longitudinal direction of the page surface.

Figure 10:
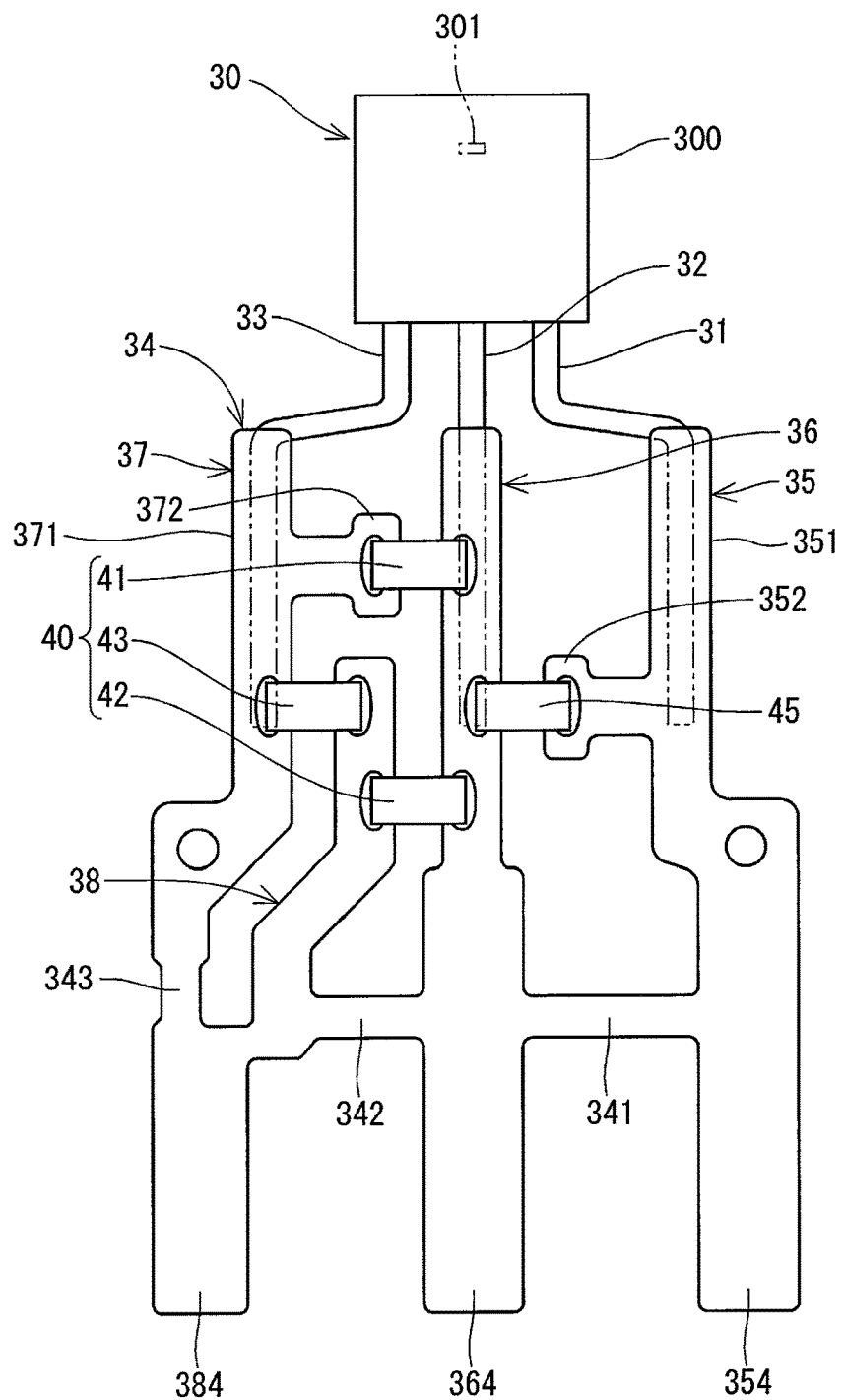
FIG. 10 is a top view illustrating the coupling terminal to which the electronic components are connected in a terminal welding process and a soldering process according to the first embodiment of the present disclosure.

Subsequent Step S2 is a terminal welding process as a terminal connecting process. As illustrated in FIG. 10, in the terminal welding process, the power supply lead 31 and the power supply terminal 35, the ground lead 32 and the ground terminal 36, and the signal lead 33 and the first signal terminal 37 are each welded.

Subsequent Step S3 is a soldering process as a filter connecting process. In the soldering process, as illustrated in FIG. 10, the capacitors 41, 42, 45 and the resistor 43 are soldered to the terminals 35 to 38, respectively.

Figure 11:
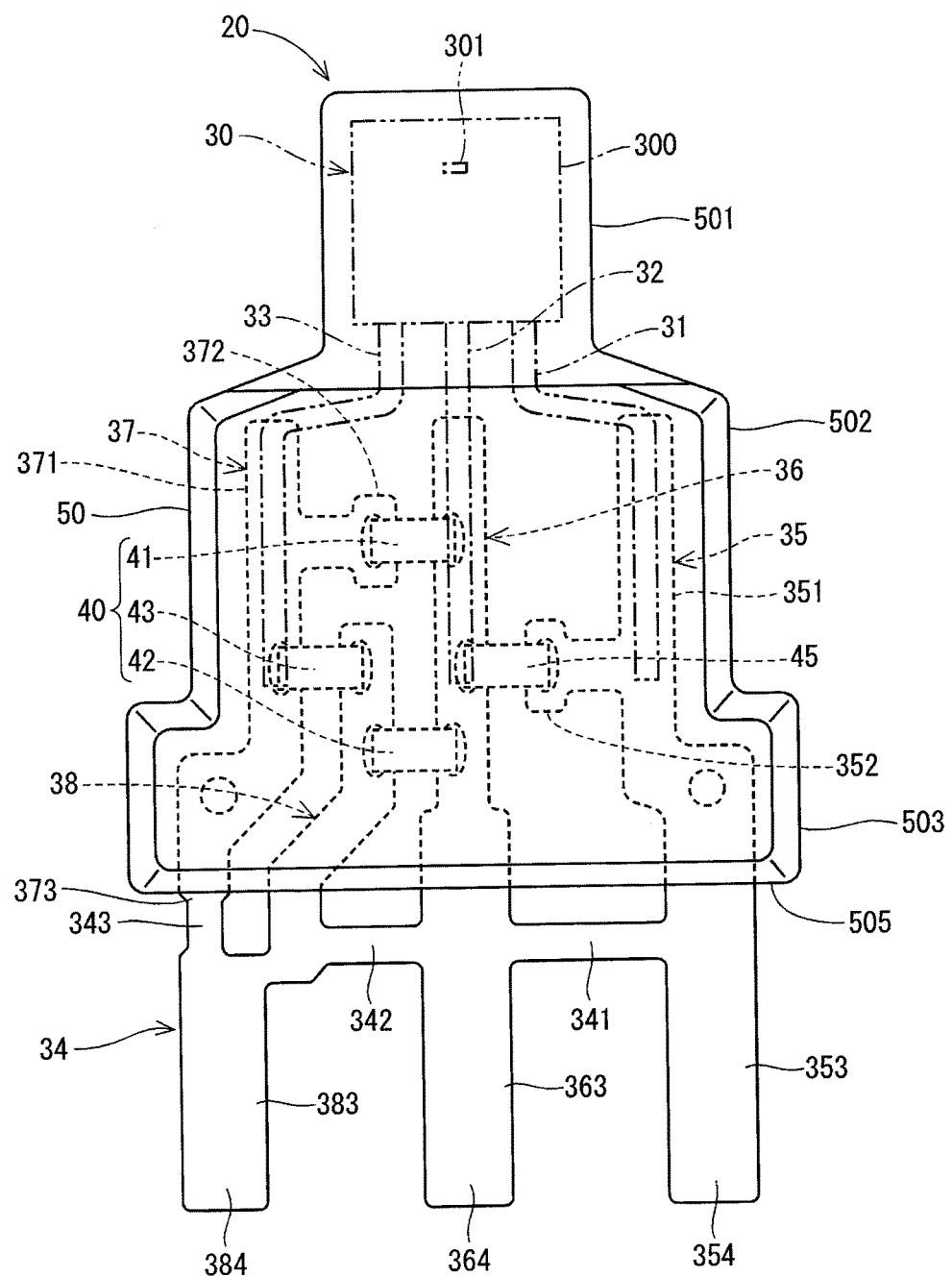
FIG. 11 is a top view illustrating the sensor in a state where parts of the electronic components and the terminals are sealed with a sealing body in the sealing process according to the first embodiment of the present disclosure.

Subsequent Step S4 is a sealing process. In the sealing process, as illustrated in FIG. 11, the sealing body 50 is formed so as to mold a part of the electronic components and the terminals 35 to 38. In this case, the sealing body 50 is formed so as to expose the coupling portions 341 to 343 of the coupling terminal 34.

Figure 12:
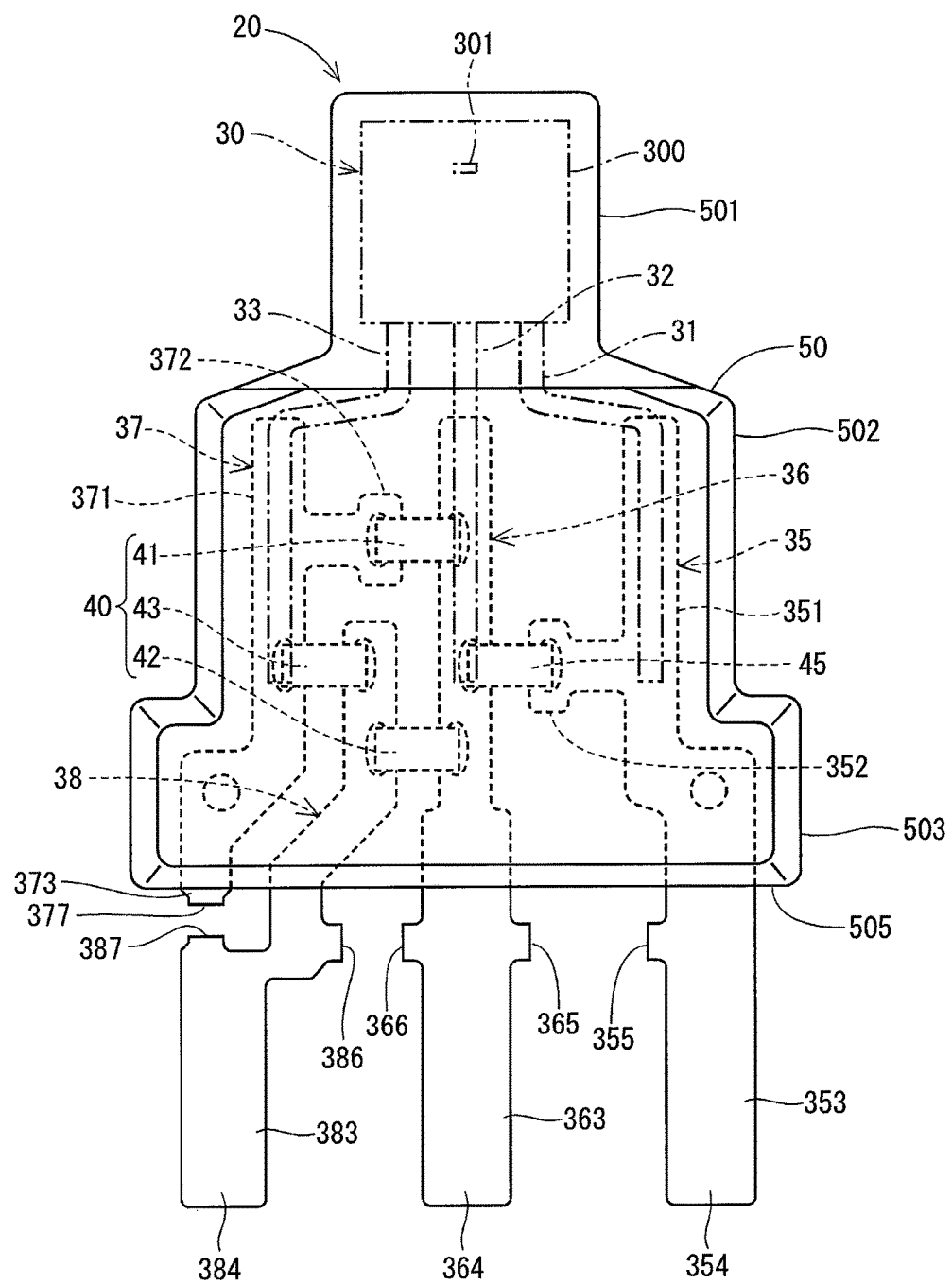
FIG. 12 is a top view illustrating the sensor in a state in which the coupling portion is cut off in the cutting process according to the first embodiment of the present disclosure.

Subsequent Step S5 is a terminal cutting process. In the terminal cutting process, the coupling portions 341 to 343 are cut off as illustrated in FIG. 12. Cutting marks at this time are cutting portions 355, 365, 366, 386, 387, and 377.

More specifically, the coupling portion 341 is cut off to disconnect the power supply terminal 35 and the ground terminal 36 from each other, and the cutting portion 355 protruding toward the ground terminal 36 side is formed in the power supply terminal 35. The cutting portion 365 protruding toward the power supply terminal 35 side is formed in the ground terminal 36. In addition, the coupling portion 342 is cut off to disconnect the ground terminal 36 and the second signal terminal 38 from each other, and the cutting portion 366 protruding toward the second signal terminal 38 side is formed in the ground terminal 36. The cutting portion 386 protruding toward the ground terminal 36 side is formed in the second signal terminal 38.

In addition, the coupling portion 343 is cut off to disconnect the first signal terminal 37 and the second signal terminal 38 from each other, and the cutting portion 377 protruding toward the second signal terminal 38 side is formed in the first signal terminal 37. The cutting portion 387 protruding toward the first signal terminal 37 side is formed in the second signal terminal 38. In other words, in the present embodiment, the coupling portion 343 between the first signal terminal 37 and the second signal terminal 38 connected in series with each other is exposed to the outside of the sealing body 50, and the coupling portion 343 is cut off outside of the sealing body 50.

The cutting portions 355, 365, 366, and 386 formed by cutting off the coupling portions 341 and 342 project perpendicularly from the respective terminals in the signal line extending direction. Cutting surfaces of the cutting portions 355, 365, 366, and 386 are formed in parallel to the signal line extending direction.

The cutting portions 377 and 387 formed by cutting off the coupling portion 343 project from the respective terminals in the signal line extending direction. Cutting surfaces of the cutting portions 377 and 387 are formed perpendicularly to the signal line extending direction.

Subsequent Step S6 is a bending process. In the bending process, the exposed portion 353 of the power supply terminal 35, the exposed portion 363 of the ground terminal 36, and the exposed portion 383 of the second signal terminal 38 are bent (refer to FIGS. 4 to 6).

The sensor 20 is produced in the manner described above. Thereafter, as illustrated in FIG. 13, the sensor 20 is combined with a sensor 120 produced in the same manner, and the power supply terminals 35, 135, the ground terminals 36, 136, and the second signal terminals 38, 138 are welded to the respective wires 22 to 25.

In the present embodiment, in the sensor 20, the first signal terminal 37 is connected to the wire 24 through the resistor 43 and the second signal terminal 38. In other words, the first signal terminal 37 is not directly connected to an external wire provided outside the sealing body 50. In the present embodiment, since the coupling portions 341 to 343 are cut off outside the sealing body 50 after the coupling terminals 34 to which the electronic components are connected have been sealed with the sealing body 50, not only the terminals 35, 36, and 38 to be connected to the wires 22 to 24 but also the first signal terminal 37 not connected to the external wire are exposed to the outside of the sealing body 50. Similarly, in the sensor 120, the first signal terminal not shown is not directly connected to the external wire, but is exposed to the outside of the sealing body 150.

Figure 2:
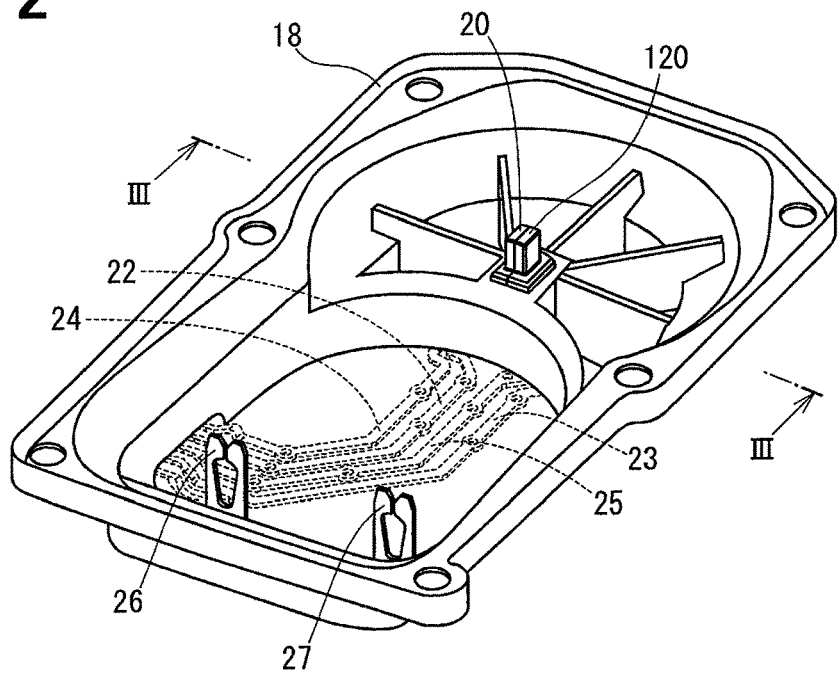
FIG. 2 is a diagram illustrating a cover in which the sensor is embedded according to the first embodiment of the present disclosure.

As illustrated in FIG. 2, the sensors 20, 120, and the wires 22 to 27 are molded with a cover 18 when forming the cover 18.

(Advantages)

As described above, in the first embodiment, the sensor 20 includes the Hall IC 30, the power supply terminal 35, the ground terminal 36, the first signal terminal 37, the second signal terminal 38, and the capacitors 41, 42, 45 and the resistor 43 which are filter members, and the sealing body 50.

The Hall IC 30 includes the power supply lead 31, the ground lead 32, and the signal lead 33, and outputs a detection signal corresponding to the rotation angle of the rotation shaft 13 as an object to be detected.

The power supply terminal 35 is connected to the power supply lead 31. The ground terminal 36 is connected to the ground lead 32. The first signal terminal 37 is connected to the signal lead 33. The second signal terminal 38 is electrically connected to the first signal terminal 37. In the present embodiment, the second signal terminal 38 is connected to the first signal terminal 37 through the resistor 43.

One of the connection ends of the capacitors 41, 42, 45 and the resistor 43 which are the filter members is connected to one of the power supply terminal 35, the ground terminal 36, the first signal terminal 37, and the second signal terminal 38, and the other connection end is connected to any other one of the power supply terminal 35, the ground terminal 36, the first signal terminal 37, and the second signal terminal 38 other than the one connection end being connected.

The sealing body 50 seals the Hall IC 30, the power supply terminal 35, the ground terminal 36, the first signal terminal 37, the second signal terminal 38, and the filter members. The power supply terminal 35, the ground terminal 36, the first signal terminal 37, and the second signal terminal 38 are partially exposed from the sealing body 50.

In the present embodiment, since the sensor 20 is provided with the capacitors 41, 42, 45, and the resistor 43 as the filter members, the electrical noise emitted to the outside can be reduced. In addition, an influence of the electrical noise from the outside to the Hall IC 30 can be reduced.

Since the power supply terminal 35, the ground terminal 36, the first signal terminal 37, and the second signal terminal 38 are partially exposed from the sealing body 50, the sensor 20 can be produced in a state where the exposed portions are connected to each other. For that reason, in the terminal welding for welding the Hall IC 30 and the coupling terminal 34, and in the soldering process for soldering the capacitors 41, 42, 45 and the resistor 43 to the respective terminals 35 to 38, the terminals 35 to 38 can be coupled into one piece. As a result, since the terminals 35 to 38 can be integrated together in the terminal welding process and the soldering process, a positional deviation such as lifting of the terminals can be prevented. In particular, the first signal terminal 37 does not move relative to the other terminals 35, 36, and 38, and are easily soldered. This makes it easy to produce the sensor 20.

In addition, since the respective terminals 35 to 38 are partially exposed from the sealing body 50, after the electronic components have been sealed and fixed by the sealing body 50, the respective terminals can be disconnected from each other. With the above configuration, since there is no need to disconnect between the respective terminals during a process of connecting the capacitors 41, 42, 45, and the resistor 43 to the terminals 35 to 38, the sensor 20 can be easily produced. In addition, since the stress to be applied to the electronic components can be reduced at the time of cutting off the coupling portions 341 to 343 of the respective terminals 35 to 38, the breakage of the electronic components during the producing can be reduced.

The filter members include the π-type filter 40 having the resistor 43, the first capacitor 41, and the second capacitor 42. The resistor 43 is connected to the first signal terminal 37 and the second signal terminal 38. The first capacitor 41 is connected to the first signal terminal 37 and the ground terminal 36. The second capacitor 42 is connected to the second signal terminal 38 and the ground terminal 36. In addition, the detection signal passes through the first signal terminal 37, the resistor 43, and the second signal terminal 38 in the stated order and is output to the outside.

The π-type filter 40 is disposed inside of the sealing body 50. For that reason, the electrical noise to be emitted to the outside of the sealing body 50 can be reduced. Since the noise of high frequency components can be attenuated with the provision of the π-type filter 40 directly below the Hall IC 30, the radiation of noise generated in the sensor 20 toward the outside can be reduced. In addition, the penetration of the noise propagated through the wires 22 to 27 into the Hall IC 30 can be reduced.

The filter members include a third capacitor 45 that is connected to the power supply terminal 35 and the ground terminal 36. As a result, a high voltage caused by static electricity can be prevented from being applied to the Hall IC 30.

According to the first embodiment, the resistor 43, the first capacitor 41, the second capacitor 42, and the third capacitor 45 are chip-type, and directions for connecting both connection ends of the respective components are identical with each other. In this example, "the directions connecting both of the connection ends to each other are identical with each other" means that a deviation in degree of error is allowed. This makes it easier to dispose the resistor 43 and the capacitors 41, 42, 45 at predetermined places with the use of a robot or the like in the soldering process.

The power supply terminal 35, the ground terminal 36, the first signal terminal 37, and the second signal terminal 38 are exposed from the front end portion 505 which is an end of the sealing body 50 opposite to the side where the Hall IC 30 is provided. The cutting portion 377, which is the front end portion of the exposed portion 373 of the first signal terminal 37, faces the exposed portion 383 of the second signal terminal 38. As a result, the first signal terminal 37 and the second signal terminal 38 can be properly disconnected from each other.

The method for producing the sensor 20 including the Hall IC 30, the power supply terminal 35, the ground terminal 36, the first signal terminal 37, the second signal terminal 38, the filter members, and the sealing body 50 includes the terminal welding process (S2), the soldering process (S3), the sealing process (S4), and a terminal cutting process (S5).

In the terminal welding process (S2), the power supply lead 31 and the power supply terminal 35, the ground lead 32 and the ground terminal 36, and the signal lead 33 and the first signal terminal 37 are connected to each other by the coupling terminal 34 where the power supply terminal 35, the ground terminal 36, the first signal terminal 37, and the second signal terminal 38 are coupled integrally by the coupling portions 341 to 343.

In the soldering process (S3), the capacitors 41, 42, 45, and the resistor 43 as the filter members are connected to the coupling terminal 34.

In the sealing process (S4), the sealing body 50 seals the Hall IC 30, the power supply terminal 35, the ground terminal 36, the first signal terminal 37, the second signal terminal 38, and the filter members so that the coupling portions 341 to 343 are exposed from the sealing body 50.

In the terminal cutting process (S5), the coupling portions 341 and 342 are cut off outside the sealing body 50 so that the power supply terminal 35, the ground terminal 36, and the second signal terminal 38 are separated from each other.

According to the present embodiment, when the terminal welding process and the soldering process are performed, since the terminals 35 to 38 are integrated together as the coupling terminal 34, the terminals can be fixed. This makes it possible to prevent a positional deviation such as terminal floating in the terminal welding process and the soldering process, and makes it easy to produce the sensor as compared with the case where the terminal welding process and the soldering process are performed in a state where the terminals 35 to 38 are separated from each other. Further, the coupling portions 341 to 343 of the coupling terminal 34 are cut off in a state where the coupling terminal 34 is connected with the Hall IC 30, the capacitors 41, 42, 45, and the resistor 43, and sealed with the sealing body 50. Therefore, a stress applied to the electronic components at the time of cutting off can be reduced, and the electronic components can be prevented from being damaged.

In the present embodiment, in the terminal cutting process, the coupling portion 343 is further cut off outside the sealing body 50 so that the first signal terminal 37 and the second signal terminal 38 are separated from each other. In the present embodiment, the first signal terminal 37 and the second signal terminal 38 are connected by the resistor 43 so as to form the π-type filter 40 in the sensor 20. As described above, since the filter members are connected to each other in a state in which the terminals 35 to 38 are coupled together as the coupling terminal 34, each terminal does not move relative to other terminals and is easily soldered.

Further, since the first signal terminal 37 and the second signal terminal 38 can be disconnected by cutting off the coupling portion 343 in addition to connecting the coupling portions 341 and 342 in the terminal cutting process, there is no need to provide a step of cutting off the terminal, for example, during the soldering process and addition of processes for cutting off the signal terminals 37 and 38 can be minimized.

Second Embodiment

Figure 14:
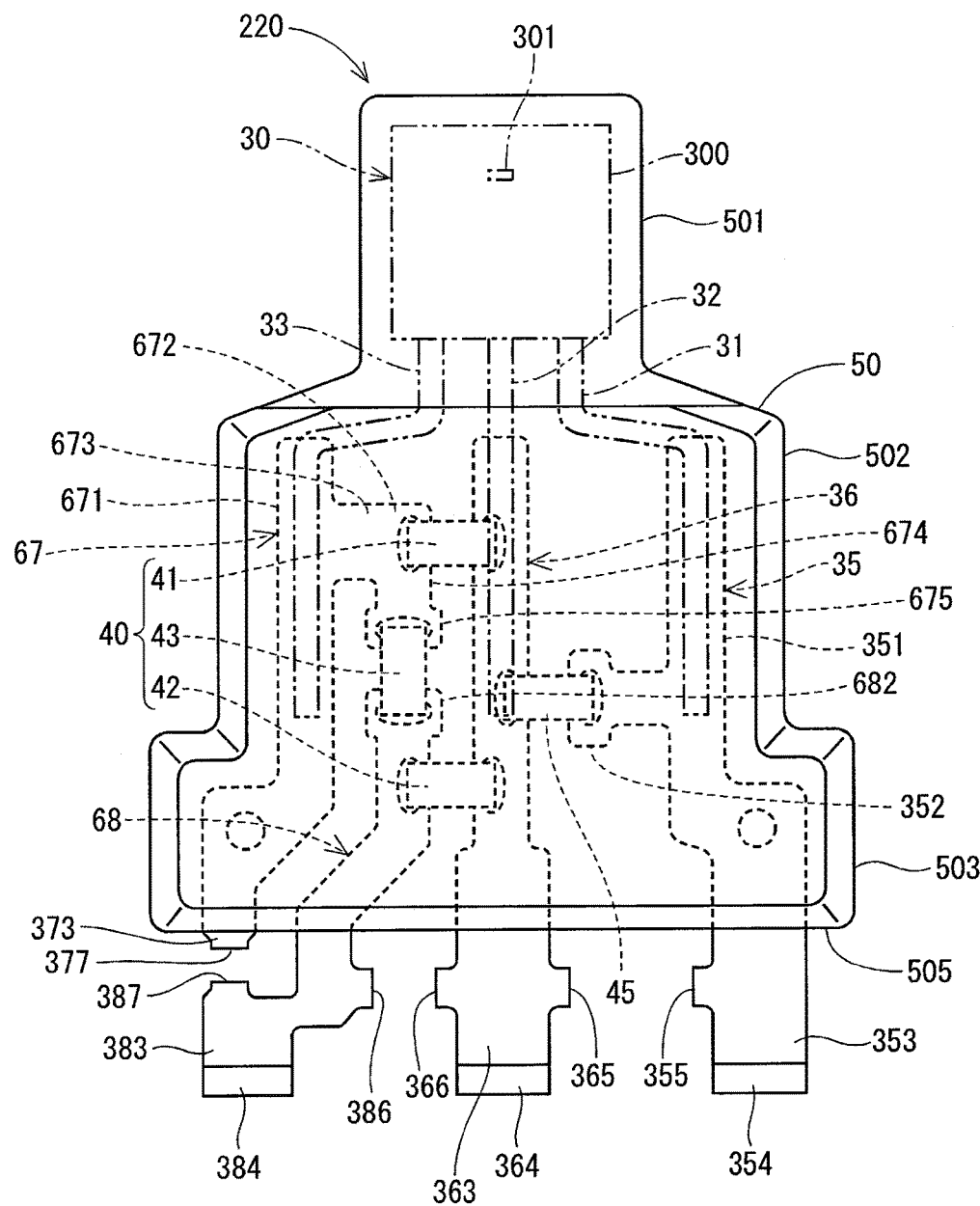
FIG. 14 is a top view illustrating a sensor according to a second embodiment of the present disclosure.

A second embodiment of the present disclosure is illustrated in FIG. 14.

As illustrated in FIG. 14, a sensor 220 according to the present embodiment is different in the shapes of a first signal terminal 67 and a second signal terminal 68 from the sensor 20 of the first embodiment.

The first signal terminal 67 includes a base portion 671 and a protrusion 672. The base portion 671 is formed in substantially the same shape as that of the base portion 371 of the signal terminal 37 in the first embodiment, and connected to a signal lead 33 on a base end side, and an exposed portion 373 is exposed from a front end portion 505 of a sealing body 50 on the front end side.

The protrusion 672 protrudes toward a ground terminal 36 side. In the present embodiment, the protrusion 672 includes a first protrusion 673 extending toward the ground terminal 36 side and a second protrusion 674 extending to the front end side from the first protrusion 673. A connecting portion 675 is formed at a front end of the second protrusion 674.

The second signal terminal 68 is located on the front end side of the protrusion 672 and is disposed between the ground terminal 36 and the first signal terminal 67. The second signal terminal 68 is formed in the same shape as that of the signal terminal 38 of the first embodiment except that the connecting portion 682 is provided on the base end side, and the exposed portion 383 is exposed from the front end portion 505 of the sealing body 50.

In the present embodiment, one connection end of the first capacitor 41 is connected to a first protrusion 673 of the protrusion 672 in the first signal terminal 67, and the other connection end of the first capacitor 41 is connected to the ground terminal 36. One connection end of the second capacitor 42 is connected to the front end side of the second signal terminal 68 relative to the connecting portion 682, and the other connection end of the second capacitor 42 is connected to the ground terminal 36 on the front end side relative to the first capacitor 41 and the third capacitor 45. One connection end of the resistor 43 is connected to the connecting portion 675 of the first signal terminal 67, and the other connection end of the resistor 43 is connected to the connecting portion 682 of the second signal terminal 68. The placement, connection, and so on of the third capacitor 45 are the same as those in the first embodiment.

In the present embodiment, as in the first embodiment, the capacitors 41, 42, and 45 are disposed such that straight lines connecting the respective connection ends to each other are perpendicular to the signal line extending direction. On the other hand, the resistor 43 is disposed so that a straight line connecting connection ends of the resistor 43 to each other is in parallel to the signal line extending direction. In other words, in the present embodiment, the resistor 43 is disposed in a direction different from that of the capacitors 41, 42, and 45. In other words, the direction connecting the connection ends of the resistor 43 is different from the direction connecting the connection ends of each of the capacitors 41, 42, and 45.

The shape of the first signal terminal 67 is changed as described above, thereby being capable of changing the placement of the resistor 43 and the first capacitor 41.

Besides, all of the cutting portions 355, 365, 366, 386, 387, and 377 of the respective terminals 35, 36, 67, and 67 are formed outside the sealing body 50 as in the first embodiment.

Similarly, with the configuration described above, the same effects as those in the aforementioned embodiment can be obtained.

Third Embodiment

Figure 15:
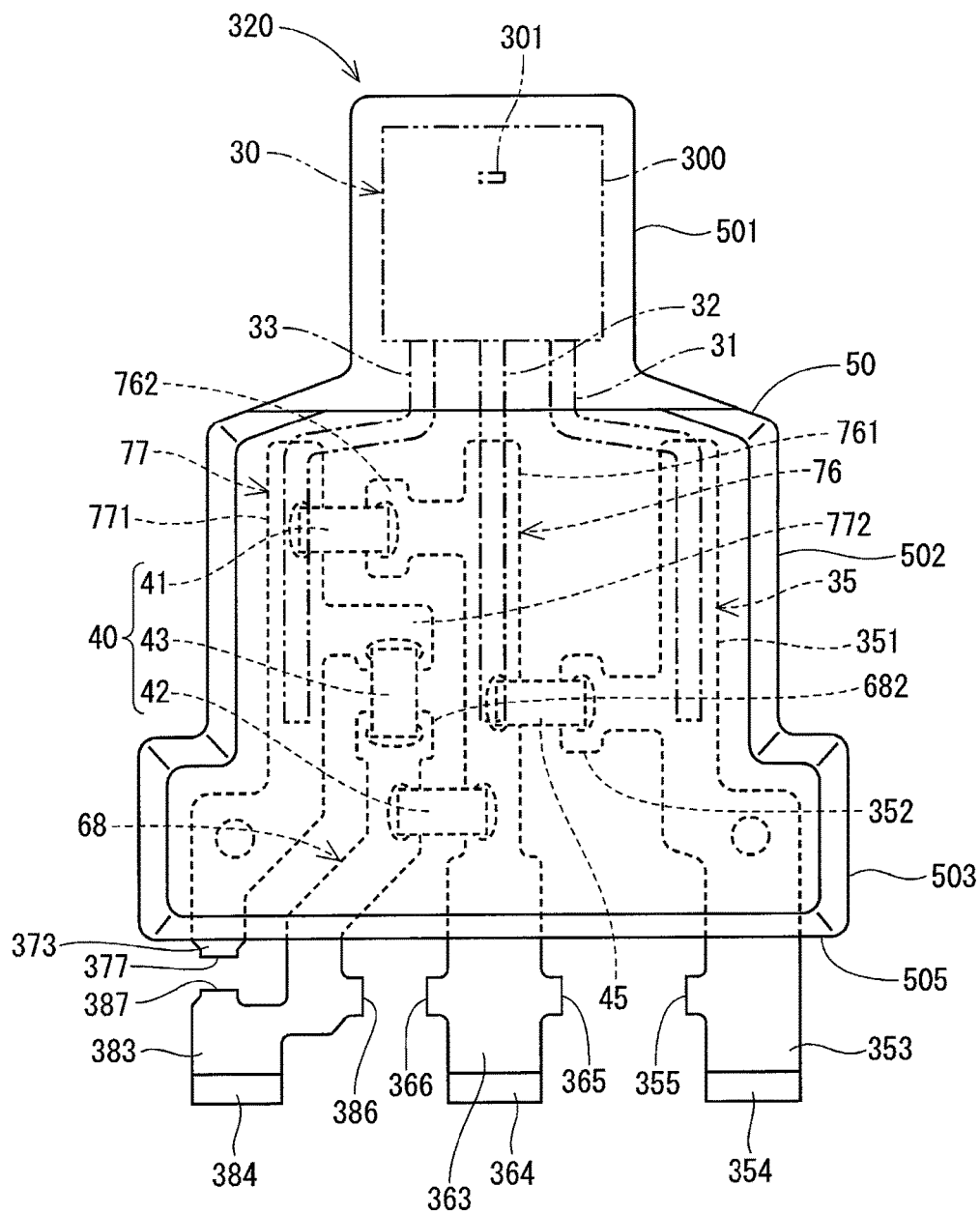
FIG. 15 is a top view illustrating a sensor according to a third embodiment of the present disclosure.

A third embodiment of the present disclosure is illustrated in FIG. 15.

As illustrated in FIG. 15, a ground terminal 76 of a sensor 320 according to the present embodiment includes a base portion 761 and a protrusion 762. The base portion 761 is formed in substantially the same shape as that of the ground terminal 36 in the first embodiment, and connected to a signal lead 33 on a base end side, and an exposed portion 363 is exposed from a front end portion 505 of a sealing body 50 on a front end side. The protrusion 762 protrudes toward a first signal terminal 77 side from the base portion 761.

The first signal terminal 77 includes a base portion 771 and a protrusion 772. The base portion 771 is formed in substantially the same shape as that of the base portion 371 in the first embodiment, and connected to the signal lead 33 on a base end side, and an exposed portion 373 is exposed from the front end portion 505 of the sealing body 50 on the front end side. The protrusion 772 protrudes toward the ground terminal 76 side on the front end side of the protrusion 762 of the ground terminal 76. The front end side of the protrusion 772 faces the connecting portion 682 of the second signal terminal 68.

The shape and the like of the second signal terminal 68 are the same as those in the second embodiment, and the second signal terminal 68 is located on the front end side of the protrusion 772 and is disposed between the ground terminal 76 and the first signal terminal 77.

One connection end of the first capacitor 41 is connected to the base portion 771 of the first signal terminal 77 on the front end side of the protrusion 772, and the other connection end of the first capacitor 41 is connected to the protrusion 762 of the ground terminal 76.

One connection end of the second capacitor 42 is connected to the second signal terminal 68, and the other connection end of the second capacitor 42 is connected to the base portion 761 of the ground terminal 76 on the front end side of the first capacitor 41 and the third capacitor 45.

One connection end of the resistor 43 is connected to the protrusion 772 of the first signal terminal 77, and the other connection end of the resistor 43 is connected to the connecting portion 682 of the second signal terminal 68. The placement, connection, and so on of the third capacitor 45 are the same as those in the first embodiment.

In the present embodiment, as in the second embodiment, the capacitors 41, 42, and 45 are disposed to be perpendicular to the signal line extending direction, and the resistor 43 is disposed to be in parallel to the signal line extending direction. In other words, in the present embodiment, the resistor 43 is disposed in a direction different from that of the capacitors 41, 42, and 45.

The shapes of the ground terminal 76 and the first signal terminal 77 are changed as described above, thereby being capable of changing the placement of the resistor 43 and the first capacitor 41.

Besides, all of cutting portions 355, 365, 366, 386, 387, and 377 of the respective terminals 35, 76, 68, and 77 are formed outside the sealing body 50 as in the first embodiment.

Similarly, with the configuration described above, the same effects as those in the aforementioned embodiment can be obtained.

Fourth Embodiment

Figure 16:
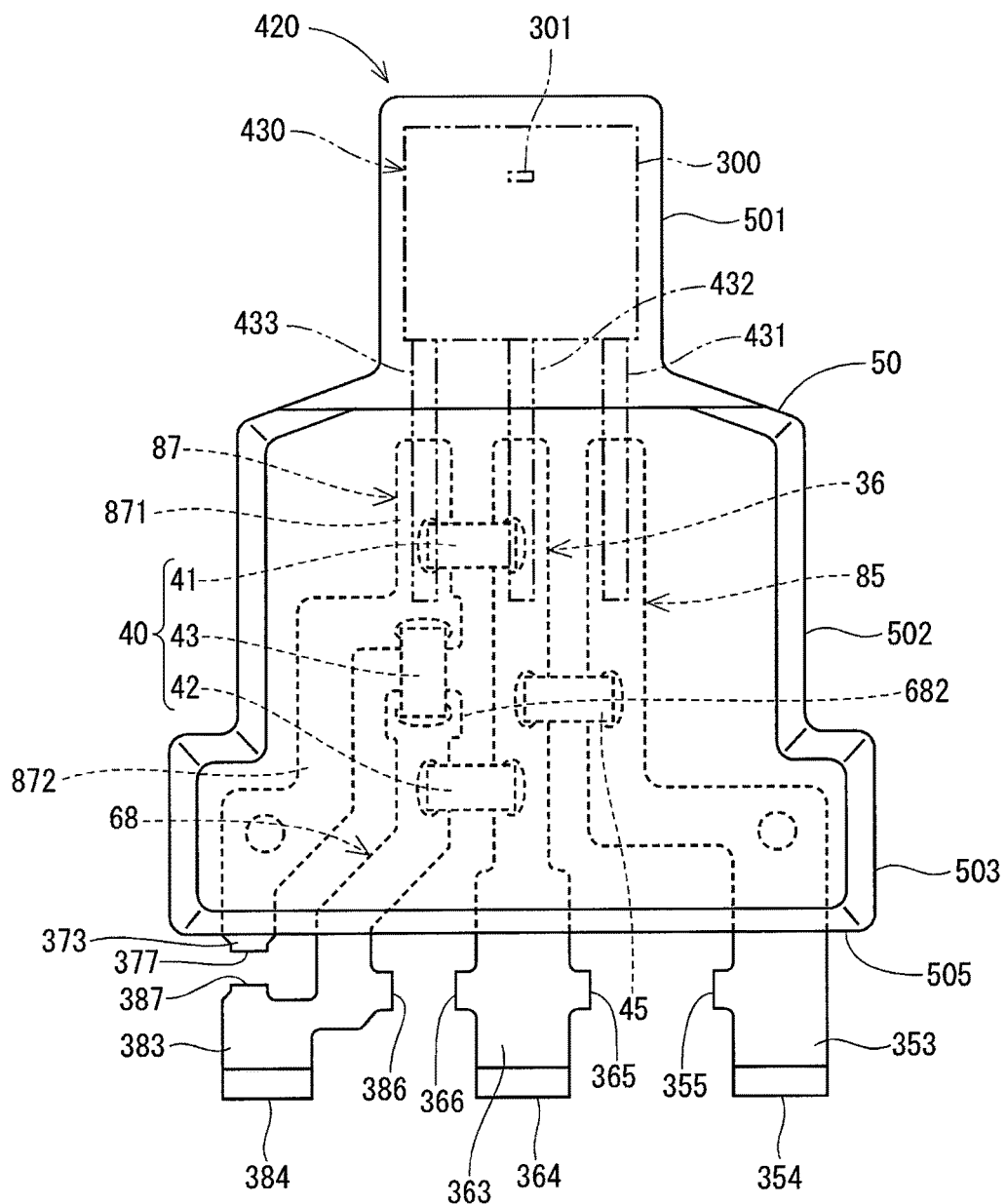
FIG. 16 is a top view illustrating a sensor according to a fourth embodiment of the present disclosure.

A fourth embodiment of the present disclosure is illustrated in FIG. 16.

As illustrated in FIG. 16, a sensor 420 according to the present embodiment includes a Hall IC 430, a power supply terminal 85, a ground terminal 36, a first signal terminal 87, a second signal terminal 68, capacitors 41, 42, 45, a resistor 43, a sealing body 50, and the like.

The Hall IC 430 includes a sensor unit 300, a power supply lead 431, a ground lead 432, and a signal lead 433. In the present embodiment, the leads 431 to 433 are formed to extend substantially straight from the same side surface of the sensor portion 300. For that reason, as compared with the first embodiment and the like, distances between the respective leads 431 to 433 on a front end side are narrowed.

The leads 431 to 433 are connected to the power supply terminal 85, the ground terminal 36 and the first signal terminal 87, respectively.

The power supply terminal 85 is formed so as to extend in a signal line extending direction and is formed so that a front end side of the power supply terminal 85 is located at a side away from the ground terminal 36 more than a base end side of the power supply terminal 85. In the power supply terminal 85, an exposed portion 353 and so on are formed in the same manner as that of the base portion 351 of the power supply terminal 35 in the first embodiment, except that a base end side of the power supply terminal 85 is closer to the ground terminal 36 side so as to correspond to the position of the front end portion of the power supply lead 431.

The first signal terminal 87 has a first base portion 871 and a second base portion 872 integrally formed. The first base portion 871 extends in the signal line extending direction on the base end side and is formed in a substantially L shape extending in a direction away from the ground terminal 36 on the front end side. The first base portion 871 is connected to the signal lead 433 on the base end side. The second base portion 872 is formed on the base end side of the first base portion 871 and extends from an end portion on the opposite side to the ground terminal 36 to the front end side. The shape of the front end side of the second base portion 872 is the same as the shape of the front end side of the base portion 371 of the first signal terminal 37 in the first embodiment, and the exposed portion 373 is exposed from the sealing body 50.

The shape and the like of the second signal terminal 68 are the same as those in the second embodiment, and the second signal terminal 68 is located on the front end side of the first base portion 871, and is disposed between the second base portion 872 and the ground terminal 36.

One connection end of the first capacitor 41 is connected to the first base portion 871 of the first signal terminal 87, and the other connection end of the first capacitor 41 is connected to the ground terminal 36. One connection end of the resistor 43 is connected to the front end side of the first base portion 871 of the first signal terminal 87 relative to the first capacitor 41, and the other connection end of the resistor 43 is connected to a connecting portion 682 of the second signal terminal 68. One connection end of the third capacitor 45 is connected to the power supply terminal 85, and the other connection end of the third capacitor 45 is connected to the ground terminal 36 between the first capacitor 41 and the second capacitor 42. The placement, connection, and so on of the second capacitor 42 are the same as those in the second embodiment.

In the present embodiment, as in the second embodiment, the capacitors 41, 42, and 45 are disposed to be perpendicular to the signal line extending direction, and the resistor 43 is disposed to be in parallel to the signal line extending direction. In other words, in the present embodiment, the resistor 43 is disposed in a direction different from that of the capacitors 41, 42, and 45.

As described above, the shapes of the power supply terminal 85 and the first signal terminal 87 are changed so that the shapes of the power supply lead 431, the ground lead 432 and the signal lead 433 of the Hall IC 430 can be changed.

Besides, all of the cutting portions 355, 365, 366, 386, 387, and 377 of the respective terminals 85, 36, 87, and 68 are formed outside the sealing body 50 as in the first embodiment.

Similarly, with the configuration described above, the same effects as those in the aforementioned embodiment can be obtained.

Fifth Embodiment

Figure 17:
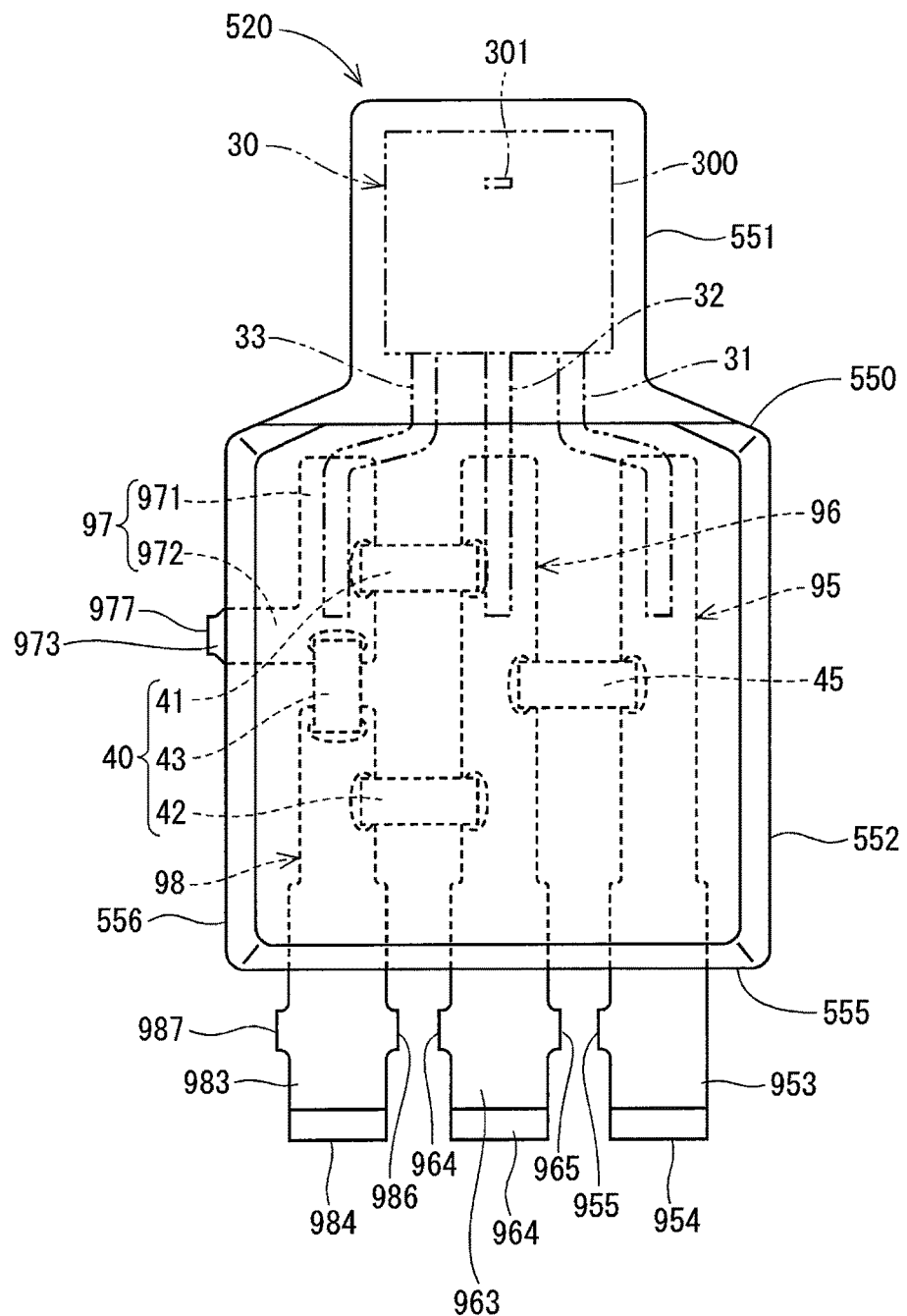
FIG. 17 is a top view illustrating a sensor according to a fifth embodiment of the present disclosure.
Figure 18:
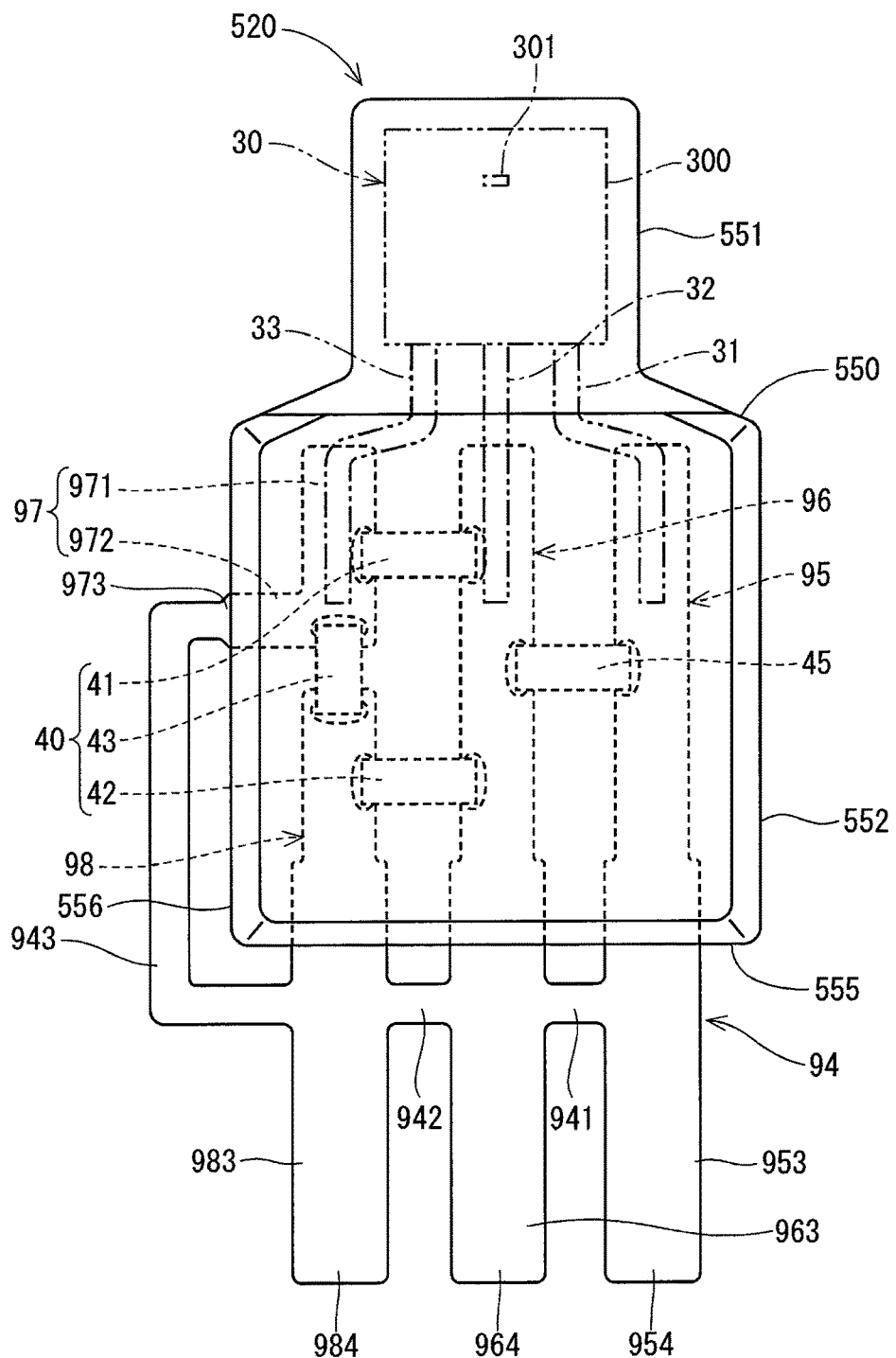
FIG. 18 is a top view illustrating a state during production of the sensor in progress according to the fifth embodiment of the present disclosure, which illustrates a state before cutting a coupling portion of a coupling terminal.

A fifth embodiment of the present disclosure is illustrated in FIGS. 17 and 18.

As illustrated in FIG. 17, a sensor 520 according to the present embodiment includes a Hall IC 30, a power supply terminal 95, a ground terminal 96, a first signal terminal 97, a second signal terminal 98, capacitors 41, 42, 45, a resistor 43, a sealing body 550, and the like.

The sealing body 550 includes an IC sealing portion 501 and a terminal sealing portion 552, which are integrally formed. The terminal sealing portion 552 is provided on the front end side of the IC sealing portion 501 and is formed in a substantially rectangular shape, and formed to be narrower than the intermediate portion 502 and the terminal forming portion 503 of the first embodiment or the like. In the present embodiment, front end sides of the power supply terminal 95, the ground terminal 96, and the second signal terminal 98 are exposed from a front end portion 555 which is a front end side of the terminal sealing portion 552. The first signal terminal 97 is exposed from a side end portion 556 of the terminal sealing portion 552.

The power supply terminal 95 is formed so as to extend substantially straight in a signal line extending direction as a whole and is connected to the power supply lead 31 on the base end side and the exposed portion 953 is exposed from the front end portion 555 of the sealing body 550 on the front end side. The exposed portion 953 has a connection end portion 954 connected to the wire 22 and a cutting portion 955 which is a cutting mark protruding toward the ground terminal 96 side. As compared to the first embodiment, the exposed portion 953 has substantially the same shape and the like as those of the exposed portion 353, except that the cutting portion 955 is close to the ground terminal 96.

The ground terminal 96 is formed in substantially the same manner as that of the ground terminal 36 in the first embodiment, and connected to a ground lead 32 on a base end side, and an exposed portion 963 is exposed from the front end portion 555 of the sealing body 550 on the front end side. The exposed portion 963 is provided with a connection end portion 964 that is connected to the wire 23, a cutting portion 965 which is a cutting mark protruding toward the power supply terminal 95 side, and a cutting portion 966 which is a cutting mark protruding toward the second signal terminal 98 side. As compared to the first embodiment, the exposed portion 963 has substantially the same shape and the like as those of the exposed portion 363, except that the cutting portion 965 is close to the power supply terminal 95 and the cutting portion 966 is close to the second signal terminal 98.

The power supply terminal 95, the ground terminal 96 and the second signal terminal 98 are linearly formed so as to extend in directions parallel to each other. The first signal terminal 97 has a linear portion 971 that is formed on an extension line of the second signal terminal 98 and a protruding portion 972 that extends from the front end side of the linear portion 971 in a direction opposite to the ground terminal 96 and is formed to protrude outward from a side end portion 556 of the sealing body 550. The base end side of the linear portion 971 is connected to the signal lead 33. A portion of the protruding portion 972 exposed from the sealing body 550 is defined as an exposed portion 973. The front end portion of the exposed portion 973 is a cutting portion 977 which is a cutting mark formed by cutting off a portion coupled to the second signal terminal 98 during production.

The second signal terminal 98 is provided on the front end side of the linear portion 971 of the first signal terminal 97 and is formed to extend in the signal line extending direction as a whole. The exposed portion 983 of the second signal terminal 98 on the front end side is exposed from the front end portion 555 of the sealing body 550. The exposed portion 983 is provided with a connection end portion 984 that is connected to the wire 24, a cutting portion 986 which is a cutting mark protruding toward the ground terminal 96 side, and a cutting portion 987 which is a cutting mark protruding toward an opposite side to the ground terminal 96.

One connection end of the first capacitor 41 is connected to the linear portion 971 of the first signal terminal 97, and the other connection end of the first capacitor 41 is connected to the ground terminal 96.

One connection end of the second capacitor 42 is connected to the second signal terminal 98, and the other connection end of the second capacitor 42 is connected to the ground terminal 96 on the front end side of the first capacitor 41.

One connection end of the resistor 43 is connected to the front end side of the linear portion 971 in the first signal terminal 97 relative to the first capacitor 41, and the other connection end of the resistor 43 is connected to a base end side of the second signal terminal 98. With the above configuration, the first signal terminal 97 and the second signal terminal 98 are connected in series with each other through the resistor 43.

One connection end of the third capacitor 45 is connected to the power supply terminal 95, and the other connection end of the third capacitor 45 is connected to the ground terminal 96 between the first capacitor 41 and the second capacitor 42.

In the present embodiment, as in the second embodiment, the capacitors 41, 42, and 45 are disposed to be perpendicular to the signal line extending direction, and the resistor 43 is disposed to be in parallel to the signal line extending direction. In other words, in the present embodiment, the resistor 43 is disposed in a direction different from that of the capacitors 41, 42, and 45.

As illustrated in FIG. 18, in the processes up to the terminal cutting process, the terminals 95 to 98 serve as a coupling terminal 94 coupled by the coupling portions 941, 942, and 943. In detail, the coupling portion 941 couples the power supply terminal 95 with the ground terminal 96 in a direction perpendicular to the signal line extending direction, in substantially the same manner as that of the coupling portion 341 in the first embodiment. The coupling portion 942 couples the ground terminal 96 with the second signal terminal 98 in the direction perpendicular to the signal line extending direction.

The coupling portion 943 is formed in a substantially C shape as a whole, one end of the coupling portion 943 is connected to the first signal terminal 97 on a side of the side end portion 556 of the sealing body 550, and the other end of the coupling portion 943 is connected to the second signal terminal 98 on the front end side of the front end 555 of the sealing body 550. As a result, in the coupling terminal 94, the first signal terminal 97 and the second signal terminal 98 are coupled with each other.

In the sealing process, the sealing body 550 is formed in a state where the coupling portions 941 to 943 are exposed. As in the first embodiment, the coupling portions 941 to 943 are cut off in the terminal cutting process after the sealing process. As a result, the power supply terminal 95, the ground terminal 96, the first signal terminal 97, and the second signal terminal 98 are disconnected from each other.

In the present embodiment, both of the cutting portion 977 of the first signal terminal 97 and the cutting portion 987 of the second signal terminal 98 formed by cutting off the coupling portion 943 face an opposite side to the ground terminal 36, and protrude perpendicularly to the signal line extending direction. The cutting surfaces of the cutting portions 977 and 987 are formed in parallel to the signal line extending direction.

In the present embodiment, as in the embodiments described above, the respective portions of the terminals 95 to 98 exposed from the sealing body 550 can be coupled with each other by the coupling portions 941 to 943 in the terminal welding process, the soldering process, and the sealing process. For that reason, the same effects as those of the first to fourth embodiments can be obtained. Furthermore, since the linear portion 971 of the first signal terminal 97 and the second signal terminal 98 are provided on the same straight line, a width of the sealing body 550 can be reduced.

Sixth Embodiment

Figure 19:
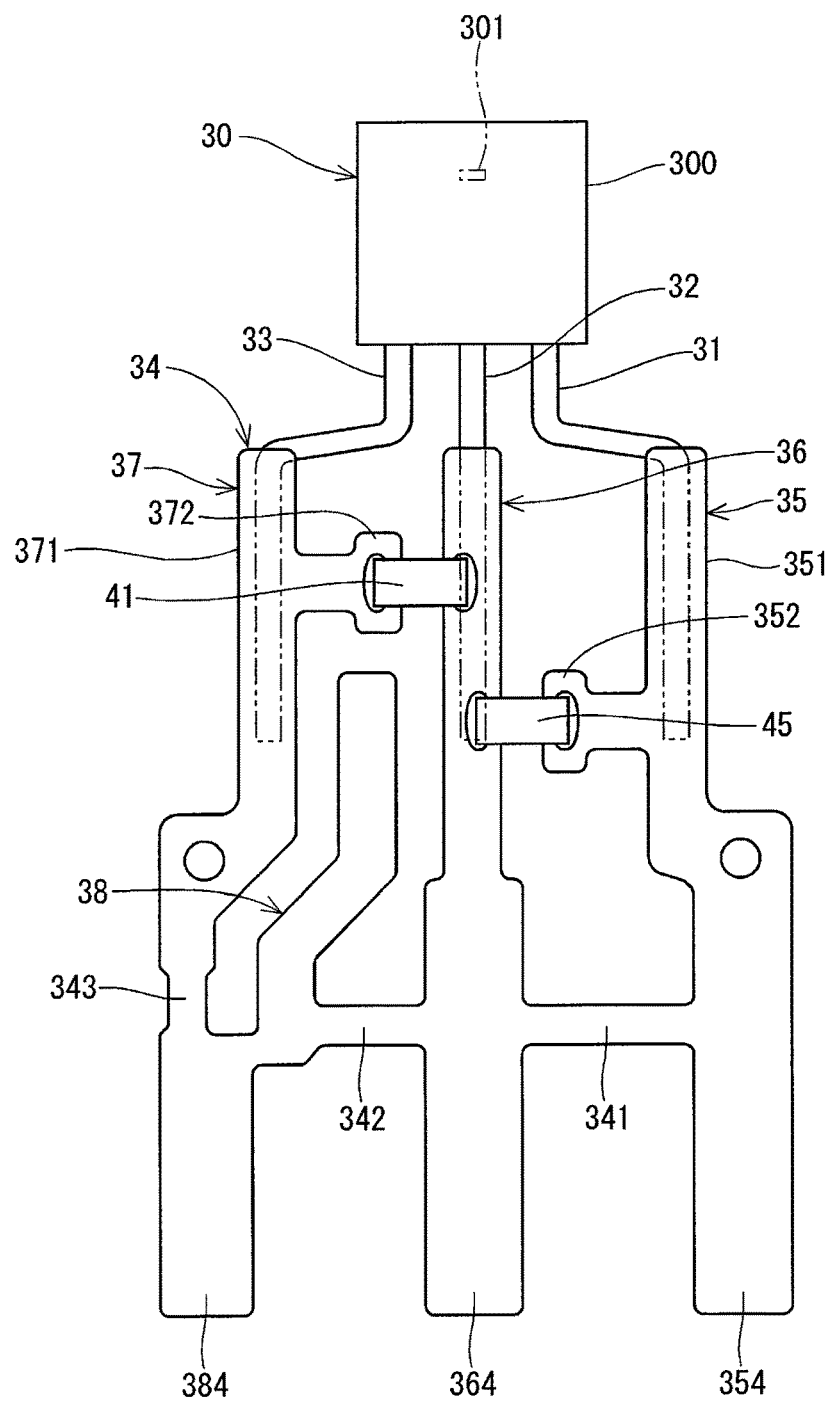
FIG. 19 is a top view illustrating a coupling terminal in a state of being connected with electronic components according to a sixth embodiment of the present disclosure.
Figure 20:
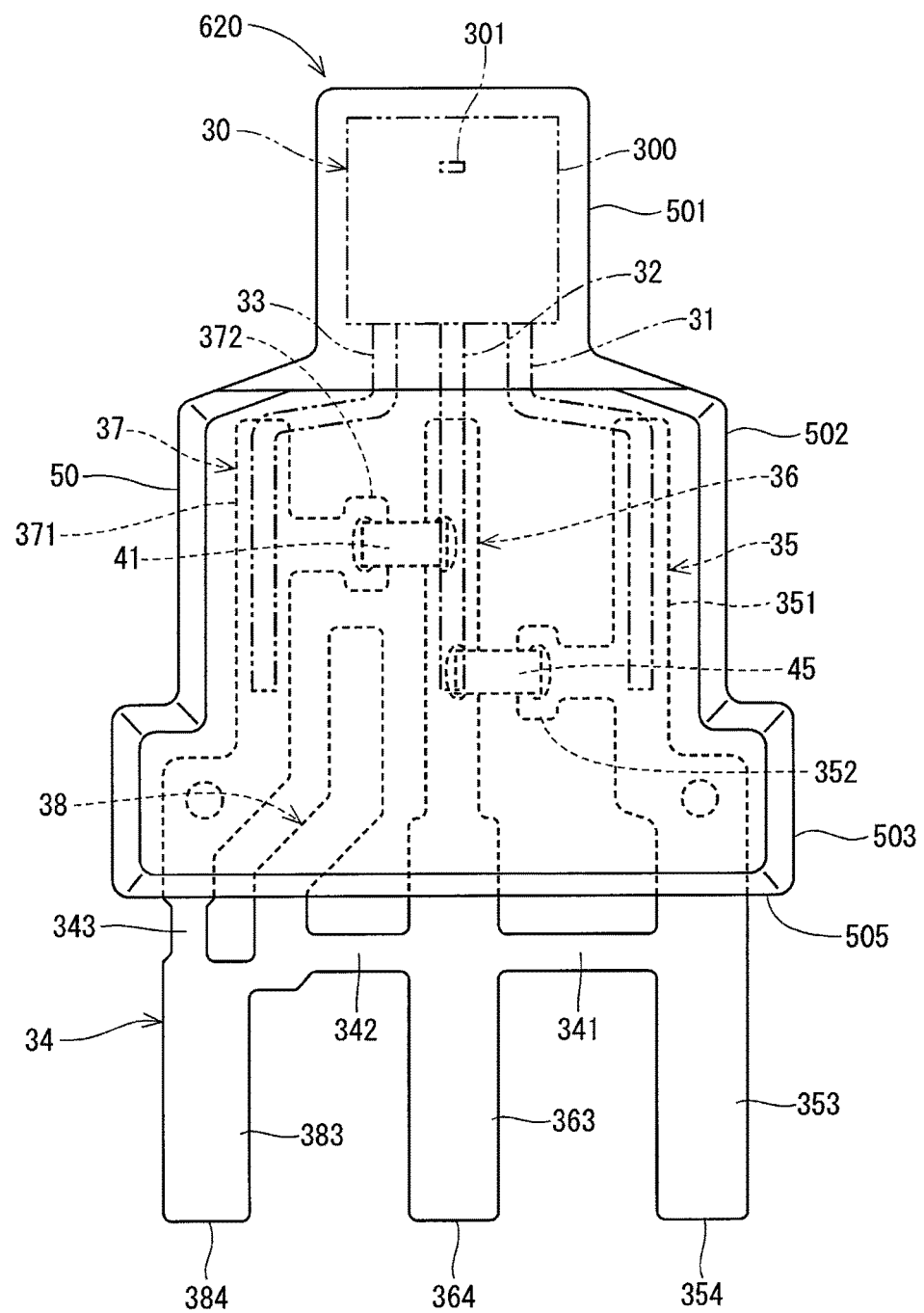
FIG. 20 is a top view illustrating a state before cutting a coupling portion of a coupling terminal according to the sixth embodiment of the present disclosure.
Figure 21:
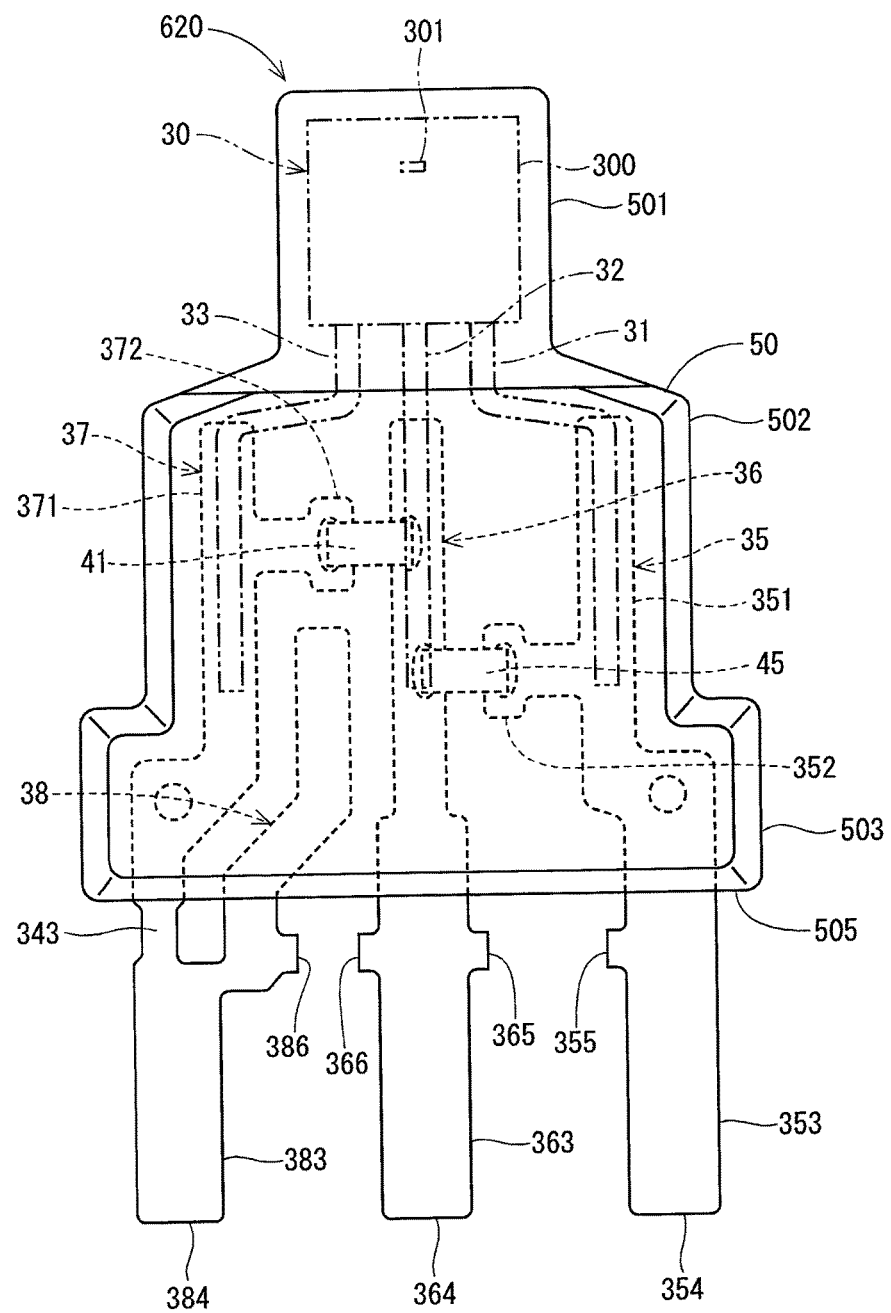
FIG. 21 is a top view illustrating a sensor according to a sixth embodiment of the present disclosure.

A sixth embodiment of the present disclosure is illustrated in FIGS. 19 to 21. FIG. 19 corresponds to FIG. 10, FIG. 20 corresponds to FIG. 11, and FIG. 21 corresponds to FIG. 12.

As illustrated in FIG. 21, a sensor 620 according to the present embodiment includes a Hall IC 30, a power supply terminal 35, a ground terminal 36, a first signal terminal 37, a second signal terminal 38, a first capacitor 41, a third capacitor 45, a sealing body 50, and the like. In other words, the present embodiment is different from the first embodiment in that the first capacitor 41 and the third capacitor 45 are provided as the filter members, and the second capacitor 42 and the resistor 43 are omitted. In other words, the sensor 620 of the present embodiment does not include a π-type filter.

The process for producing a sensor 620 is substantially the same as that in the first embodiment. As illustrated in FIG. 19, the respective leads 31 to 33 of the Hall IC 30 are connected to the coupling terminal 34 in the terminal welding process, and the capacitors 41 and 45 are connected to the coupling terminal 34 in the soldering process.

As illustrated in FIG. 20, in the sealing process, the coupling terminal 34 and the electronic component are sealed with the sealing body 50 in a state where the coupling portions 341 to 343 are exposed.

As illustrated in FIG. 21, in the terminal cutting process, the coupling portions 341 and 342 are cut off. The present embodiment is different from the first embodiment in that the coupling portion 343 is not cut off. Since the sensor 620 is provided with no π-type filter and a resistor is not connected in series to the signal line, there is no need to divide the signal terminals 37 and 38. For that reason, in the cutting process, cutting of the coupling portion 343 is omitted, and the first signal terminal 37 and the second signal terminal 38 are coupled to each other by the coupling portion 343.

As described above, the number and location of capacitors and resistors provided for the terminals 35 to 38 are changed, thereby being capable of incorporating an appropriate filter according to a function of the sensor. The sensor 620 according to the present embodiment is provided with no π-type filter, and is suitably used, for example, when the output of the Hall IC 30 is an analog output.

In the present embodiment, the filter members include the first capacitor 41 and the third capacitor 45. The first capacitor 41 is connected to the first signal terminal 37 and the ground terminal 36. The third capacitor 45 is connected to the power supply terminal 35 and the ground terminal 36. In addition, the first signal terminal 37 and the second signal terminal 38 are coupled to each other outside the sealing body 50.

With the provision of the coupling portion 343 that couples the first signal terminal 37 with the second signal terminal 38 outside of the sealing body 50, the common terminals 35 to 38 can be used for a circuit requiring a disconnection between the first signal terminal 37 and the second signal terminal 38 and a circuit not requiring the disconnection, and the kind of components can be reduced. In addition, an appropriate filter compatible with the sensor output can be incorporated in the sensor 620.

The same effects as those in the embodiments described above can be obtained.

In the present embodiment, the first capacitor 41 corresponds to a signal side capacitor, and the third capacitor corresponds to a power supply side capacitor. In the present embodiment, the first capacitor 41 corresponds to a signal side capacitor, and the third capacitor 45 corresponds to a power supply side capacitor. Incidentally, in order to match with the first embodiment, the second capacitor is omitted. Further, in the present embodiment, although the example in which the second capacitor 42 and the resistor 43 are omitted has been described with the first embodiment as an example, the terminal shape and the like may be identical with those in the second embodiment to the fifth embodiment.

Other Embodiments

In another embodiment of the present disclosure, the integrated circuit is not limited to the Hall IC, but may be an IC having another magnetic detection element. Further, the integrated circuit is not limited to the IC having the magnetic detection element, but may be an IC having another detection element. In short, the integrated circuit only needs to output a detection signal corresponding to a physical quantity relating to the object to be detected.

In the first embodiment, the SENT communication has been exemplified as an example of the digital communication, but a communication method between the sensor and another device such as an ECU is not limited to the SENT communication, and any communication method may be used. Also, as described in the sixth embodiment, the communication method between the sensor and another device is not limited to the digital communication, but may be an analog communication.

In other embodiments of the present disclosure, the resistor, the first capacitor, the second capacitor, and the third capacitor may not be of a chip type.

In the first embodiment and the like, a total of three capacitors and one resistor, including two capacitors and a resistor forming the π-type filter and a power supply side capacitor are provided. In the sixth embodiment, two capacitors are provided. In other embodiments, the number of capacitors and resistors incorporated in the sensor can be appropriately changed according to the required filter configuration or the like.

In the sixth embodiment, the signal side capacitor is connected to the first signal terminal and the ground terminal. In other embodiments, the signal capacitor may be connected to the second signal terminal and the ground terminal.

In the embodiments described above, in the integrated circuit, the power supply lead, the ground lead, and the signal lead are arranged in the stated order from one side. In other embodiments, the placement of the leads in the Hall IC is not limited to this order, and any placement may be allowed. Also, the placement and shape of the terminals can be changed appropriately depending on the placement of the leads.

In the embodiments described above, the leads of the integrated circuit and the terminals are connected to each other by welding, and the capacitors and the resistor are connected to the terminals by soldering. In another embodiment, the method of connecting the leads of the integrated circuit and the terminals is not limited to welding, but any method such as soldering may be used. Similarly, the method of connecting the capacitors and the resistor to the terminals is not limited to soldering, and any method may be used. The same is applied to the connection between the terminals and the wires.

In another embodiment of the present disclosure, the sensor is not limited to the throttle device, but may be used for other devices.

It is noted that a flowchart or the processing of the flowchart in the present application includes sections (also referred to as steps), each of which is represented, for instance, as S1. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A sensor comprising:
an integrated circuit that includes a power supply lead, a ground lead and a signal lead, and outputs a detection signal corresponding to a physical quantity relating to a detection object;
a power supply terminal that is connected to the power supply lead;
a ground terminal that is connected to the ground lead;
a first signal terminal that is connected to the signal lead;
a second signal terminal that is electrically connected to the first signal terminal;
a filter member having one connection end connected to one of the power supply terminal, the ground terminal, the first signal terminal, and the second signal terminal, and an other connection end connected to another one of the power supply terminal, the ground terminal, the first signal terminal and the second signal terminal; and
a sealing body that seals the integrated circuit, the power supply terminal, the ground terminal, the first signal terminal, the second signal terminal and the filter member, wherein:
a part of each of the power supply terminal, the ground terminal, the first signal terminal and the second signal terminal is exposed from the sealing body.

2. The sensor according to claim 1, wherein:
the filter member includes a π-type filter having: a resistor that is connected to the first signal terminal and the second signal terminal; a first capacitor that is connected to the first signal terminal and the ground terminal; and a second capacitor that is connected to the second signal terminal and the ground terminal; and
the detection signal is output to an outside through the first signal terminal, the resistor and the second signal terminal in this order.

3. The sensor according to claim 2, wherein:
the filter member includes a power supply side capacitor that is connected to the power supply terminal and the ground terminal.

4. The sensor according to claim 3, wherein:
the resistor, the first capacitor, the second capacitor, and the power supply side capacitor are chip-type elements; and
a direction for connecting both connection ends of each element is identical with each other.

5. The sensor according to claim 1, wherein:
the power supply terminal, the ground terminal, the first signal terminal, and the second signal terminal are exposed from an end portion of the sealing body opposite to a side where the integrated circuit is disposed; and
a front end portion of an exposed portion of the first signal terminal faces an exposed portion of the second signal terminal.

6. The sensor according to claim 1, wherein:
the power supply terminal, the ground terminal, and the second signal terminal are linearly arranged to extend in parallel to each other; and
the first signal terminal includes a linear portion that is arranged on an extension line of the second signal terminal and a protruding portion that is arranged to protrude from the linear portion toward an outside of the sealing body.

7. The sensor according to claim 1, wherein:

the filter member includes a signal side capacitor that is connected to the first signal terminal or the second signal terminal and the ground terminal, and a power supply side capacitor that is connected to the power supply terminal and the ground terminal; and the first signal terminal and the second signal terminal are connected to each other at an outside of the sealing body.

8. A method for producing a sensor including:

an integrated circuit that includes a power supply lead, a ground lead, and a signal lead, and outputs a detection signal corresponding to a physical quantity relating to a detection object;

a power supply terminal that is connected to the power supply lead;

a ground terminal that is connected to the ground lead;

a first signal terminal that is connected to the signal lead;

a second signal terminal that is electrically connected to the first signal terminal;

a filter member having one connection end connected to one of the power supply terminal, the ground terminal, the first signal terminal and the second signal terminal, and an other connection end connected to another one of the power supply terminal, the ground terminal, the first signal terminal and the second signal terminal; and a sealing body that seals the integrated circuit, the power supply terminal, the ground terminal, the first signal terminal, the second signal terminal and the filter member, the method comprising:

connecting the power supply lead to the power supply terminal, connecting the ground lead to the ground terminal, and connecting the signal lead to the first signal terminal with a coupling terminal in which the power supply terminal, the ground terminal, the first signal terminal and the second signal terminal are coupled integrally by a coupling portion;

connecting the filter member to the coupling terminal;

sealing the integrated circuit, the power supply terminal, the ground terminal, the first signal terminal, the second signal terminal and the filter member with the sealing body to expose the coupling portion from the sealing body; and cutting the coupling portion at an outside of the sealing body to separate the power supply terminal, the ground terminal and the second signal terminal from each other.

9. The method for producing the sensor according to claim 8, wherein:

the cutting of the coupling portion includes cutting the coupling portion at the outside of the sealing body to separate the first signal terminal from the second signal terminal.

* * * * *